US011562925B2

(12) United States Patent
Pethe et al.

(10) Patent No.: US 11,562,925 B2
(45) Date of Patent: Jan. 24, 2023

(54) METHOD OF DEPOSITING MULTILAYER STACK INCLUDING COPPER OVER FEATURES OF A DEVICE STRUCTURE

(71) Applicant: Applied Materials, Inc., Santa Clara, CA (US)

(72) Inventors: Shirish Pethe, Cupertino, CA (US); Fuhong Zhang, San Jose, CA (US); Joung Joo Lee, San Jose, CA (US); Rui Li, San Jose, CA (US); Xiangjin Xie, Fremont, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 112 days.

(21) Appl. No.: 17/036,038

(22) Filed: Sep. 29, 2020

(65) Prior Publication Data
US 2021/0118729 A1     Apr. 22, 2021

Related U.S. Application Data

(60) Provisional application No. 62/924,070, filed on Oct. 21, 2019.

(51) Int. Cl.
| | | |
|---|---|---|
| H01L 21/768 | (2006.01) | |
| H01L 21/3215 | (2006.01) | |
| H01L 21/3213 | (2006.01) | |

(52) U.S. Cl.
CPC .... H01L 21/76871 (2013.01); H01L 21/3215 (2013.01); H01L 21/32133 (2013.01); H01L 21/76846 (2013.01); H01L 21/76855 (2013.01); H01L 21/76882 (2013.01)

(58) Field of Classification Search
None
See application file for complete search history.

(56) References Cited

U.S. PATENT DOCUMENTS

| | | | |
|---|---|---|---|
| 6,268,291 B1 * | 7/2001 | Andricacos | H01L 21/76877 257/E21.585 |
| 6,642,146 B1 | 11/2003 | Rozbicki et al. | |
| 7,855,147 B1 * | 12/2010 | Dulkin | C23C 14/022 257/E21.295 |
| 8,017,523 B1 | 9/2011 | Wu et al. | |

(Continued)

FOREIGN PATENT DOCUMENTS

KR     20170073627 A     6/2017

OTHER PUBLICATIONS

Subramanian et al., The Cu—Ta (Copper-Tantalum) System, Bulletin of Alloy Phase Diagrams 10, 652-655 (1989).

(Continued)

*Primary Examiner* — Erik Kielin
(74) *Attorney, Agent, or Firm* — Patterson & Sheridan, LLP

(57) ABSTRACT

Embodiments disclosed herein generally relate to methods of depositing a plurality of layers. A doped copper seed layer is deposited in a plurality of feature definitions in a device structure. A first copper seed layer is deposited and then the first copper seed layer is doped to form a doped copper seed layer, or a doped copper seed layer is deposited directly. The doped copper seed layer leads to increased flowability, reducing poor step coverage, overhang, and voids in the copper layer.

12 Claims, 17 Drawing Sheets

(56) References Cited

U.S. PATENT DOCUMENTS

| | | | |
|---|---|---|---|
| 8,101,517 B2 | 1/2012 | Frank et al. | |
| 9,105,695 B2 | 8/2015 | Shek et al. | |
| 9,218,980 B2 | 12/2015 | Zope et al. | |
| 9,269,615 B2 | 2/2016 | Ryan et al. | |
| 9,330,939 B2 | 5/2016 | Zope et al. | |
| 9,425,092 B2 | 8/2016 | Emesh et al. | |
| 9,685,371 B2 | 6/2017 | Zope et al. | |
| 10,062,607 B2 | 8/2018 | Emesh et al. | |
| 10,094,023 B2 | 10/2018 | Yu et al. | |
| 10,163,656 B2 | 12/2018 | Zope et al. | |
| 10,167,663 B2 | 1/2019 | Ferrer Garcia | |
| 10,453,743 B2 | 10/2019 | Jia et al. | |
| 2004/0157425 A1* | 8/2004 | Catabay | H01L 21/76844 438/597 |
| 2004/0188850 A1* | 9/2004 | Lee | H01L 21/76874 257/E21.585 |
| 2011/0074040 A1 | 3/2011 | Frank et al. | |
| 2014/0024212 A1 | 1/2014 | Ryan et al. | |
| 2014/0220772 A1* | 8/2014 | Lakshmanan | H01L 21/76843 438/597 |
| 2014/0287577 A1 | 9/2014 | Emesh et al. | |
| 2015/0299886 A1* | 10/2015 | Doubina | H01L 21/67167 204/229.4 |
| 2016/0326648 A1 | 11/2016 | Lam et al. | |
| 2017/0047249 A1 | 2/2017 | Emesh et al. | |
| 2017/0221753 A1 | 8/2017 | Jia et al. | |
| 2017/0275754 A1 | 9/2017 | Yao et al. | |
| 2017/0306488 A1 | 10/2017 | Yao et al. | |
| 2019/0393074 A1 | 12/2019 | Jia et al. | |

OTHER PUBLICATIONS

International Search Report and Written Opinion dated Jan. 12, 2021 for Application No. PCT/US2020/052425.

* cited by examiner

METHOD OF DEPOSITING MULTILAYER STACK INCLUDING COPPER OVER FEATURES OF A DEVICE STRUCTURE

CROSS-REFERENCE TO RELATED APPLICATIONS

This application claims priority to U.S. Provisional Patent Application No. 62/924,070, filed Oct. 21, 2019, which is incorporated herein by reference in its entirety.

BACKGROUND

Field

Embodiments of this disclosure relate to a method and, more specifically, to a method of depositing layers.

Description of the Related Art

Integrated circuits may include more than one million micro-electronic field effect transistors (e.g., complementary metal-oxide-semiconductor (CMOS) field effect transistors) that are formed on a substrate (e.g., semiconductor wafer) and cooperate to perform various functions within the circuit. Reliably producing smaller features is one of the key technologies for the next generation of very large scale integration (VLSI) and ultra large-scale integration (ULSI) of semiconductor devices, particularly for the 3 nanometer (N3) node. However, as the limits of integrated circuit technology are pushed, the shrinking dimensions of interconnects in VLSI and ULSI technology have placed additional demands on processing capabilities. Reliable formation of the gate pattern is important to integrated circuits success and to the continued effort to increase circuit density and quality of individual substrates and die.

In addition, the critical dimension (CD) of features for the N3 node is predicted to be about 9 nm to about 12 nm. Conventional methods of deposition have issues depositing in such a small CD opening due to pinch off of the deposited films. Resputter efficiency inside the structure is reduced for physical vapor deposition (PVD), which leads to thinner side wall deposition. In order to maintain electrical integrity of the N3 node structures for consumer devices, such as via RC constants, a reduction in film thickness in structures is desired.

One drawback in the art is that metal layers deposited using a conventional PVD process often has an unacceptable thickness profile. Poor step coverage, overhang, and voids can be formed within features, such as vias or trenches, when the feature has a critical dimension of less than about 12 nm. Insufficient deposition on the bottom and side walls of the vias or trenches can also result in deposition discontinuity, thereby resulting in device shorting or poor interconnection formation. Furthermore, the metal layer may have poor adhesion over the underlying material layer, resulting in peeling of the metal layer from the substrate and the subsequent conductive metal layer.

Therefore, there is a need for depositing metal layers in small width critical dimension features with acceptable thickness profiles.

SUMMARY

Embodiments disclosed herein generally relate to methods of depositing a plurality of layers. Methods of deposition disclosed herein allow for greater control of the flowability of copper layers. The increased flowability of the copper layers allows for more control over desired thickness profiles.

In one embodiment, a method for depositing a plurality of layers is provided, including depositing a first copper seed layer over a device structure, doping the first copper seed layer with a dopant to create a doped copper seed layer having one or more seed layer portions, and etching back the doped copper seed layer such that at least one of the one or more seed layer portions is removed. The device structure includes a layer disposed over a substrate. The layer has a surface and a plurality of feature definitions. Each of the feature definitions has a plurality of side walls and a bottom. The first copper seed layer is disposed over the surface, the plurality of side walls and the bottom.

In another embodiment, a method for depositing a plurality of layers is provided, including depositing a doped copper seed layer over a device structure, and etching back the doped copper seed layer such that at least one of the one or more seed layer portions is removed. The device structure includes a layer disposed over a substrate. The layer has a surface and a plurality of feature definitions. Each of the feature definitions has a plurality of side walls and a bottom. The doped copper seed layer is disposed over the surface, the plurality of side walls and the bottom.

In yet another embodiment, a method for depositing a plurality of layers is provided, including depositing a doped copper seed layer over a device structure, and etching back the doped copper seed layer such that at least one of the one or more seed layer portions is removed. The device structure includes a layer disposed over a substrate. The layer has a surface and a plurality of feature definitions. Each of the feature definitions has a plurality of side walls and a bottom. The doped copper seed layer is disposed over the surface, the plurality of side walls and the bottom. The depositing the doped copper seed layer includes a physical vapor deposition (PVD) process using a coil. The coil includes tantalum (Ta).

BRIEF DESCRIPTION OF THE DRAWINGS

So that the manner in which the above recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1A:
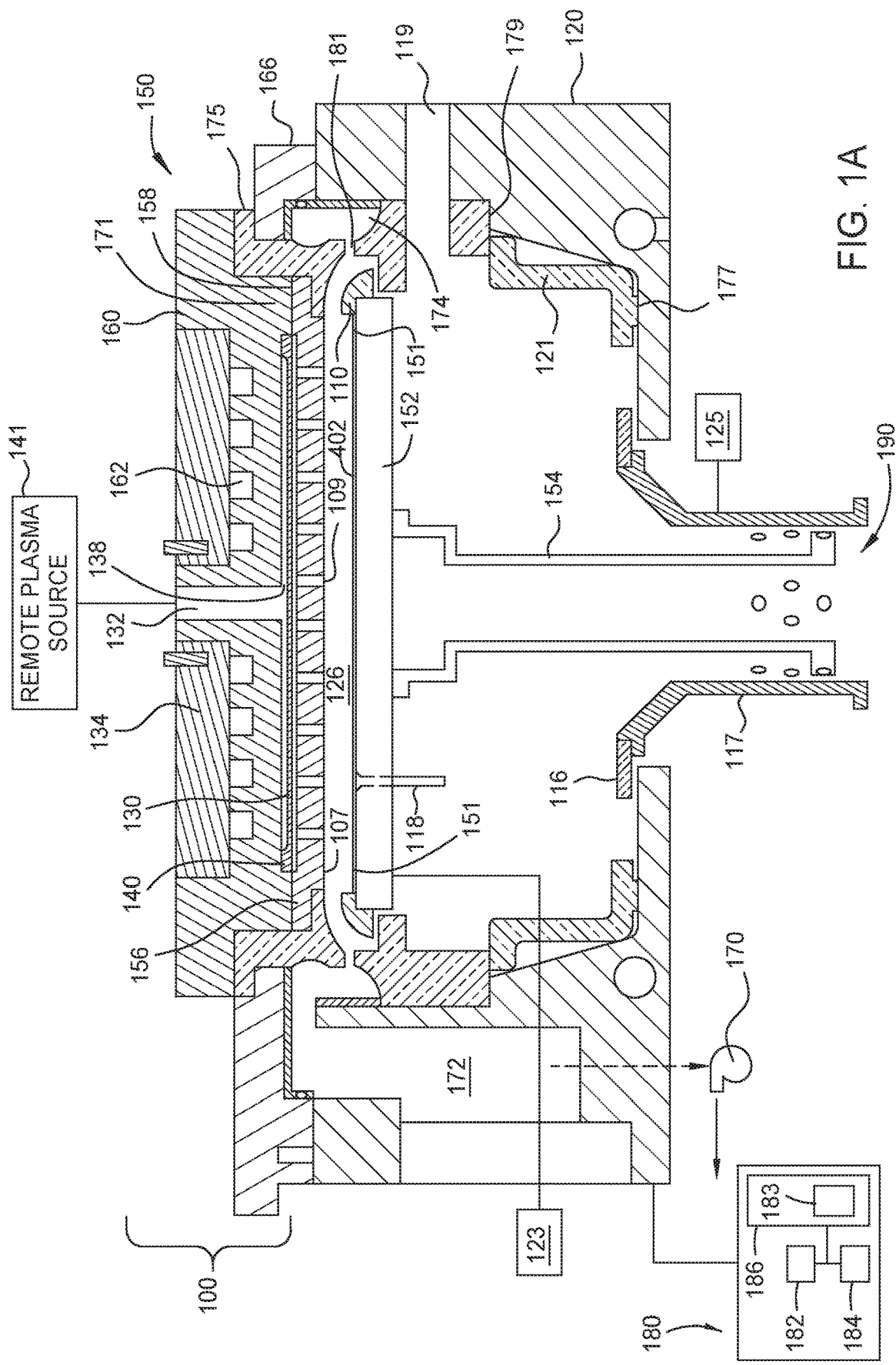
FIG. 1A illustrates a schematic side view of a processing chamber, according to at least one embodiment.

To facilitate understanding, identical reference numerals have been used, where possible, to designate identical elements that are common to the figures. It is contemplated that elements and features of one implementation may be beneficially incorporated in other implementations without further recitation. It is to be noted, however, that the appended drawings illustrate only exemplary implementations of this disclosure and are therefore not to be considered limiting of its scope, for the disclosure may admit to other equally effective implementations.

DETAILED DESCRIPTION

Embodiments disclosed herein generally relate to methods of depositing a plurality of layers. A doped copper seed layer is deposited in a plurality of feature definitions in a device structure. A first copper seed layer is deposited and then the first copper seed layer is doped to form a doped copper seed layer, or a doped copper seed layer is deposited directly. More copper layers can be deposited, and the copper layers are reflowed to create a combined copper layer. The combined copper layer can have a desired thickness profile. The doped copper seed layer leads to increased flowability, reducing poor step coverage, overhang, and voids in the combined copper layer. The desired thickness profile increases reliability of the device structure, reducing device shorting and improving interconnection formation. In addition, the combined copper layer is thinner than previously used in the art, allowing for coating of features for the 3 nanometer (N3) node. Embodiments disclosed herein may be useful for, but are not limited to, increasing the flowability of deposited copper layers using dopants.

As used herein, the term "about" refers to a +/−10% variation from the nominal value. It is to be understood that such a variation can be included in any value provided herein.

FIG. 1A illustrates a schematic side view of a processing chamber 150, according to at least one embodiment. The processing chamber 150 is configured to deposit a variety of materials, such as metal materials, onto a substrate 402 disposed within the processing chamber. As shown, the processing chamber 150 includes a pedestal assembly 190, a lid assembly 100, a chamber body 120, and a control unit 180. The chamber body 120 is configured to protect substrates disposed within the body from the environment outside the body. The metal materials can include cobalt (Co), copper (Cu), nickel (Ni), derivatives thereof, or combinations thereof. The processing chamber 150 can be used to perform CVD, plasma enhanced-CVD (PE-CVD), pulsed-CVD, ALD, PE-ALD, derivatives thereof, or combinations thereof. The processing chamber 150 can be used to anneal previously deposited metal layers. Thus, both the deposition processes and the subsequent annealing may be performed in-situ in the same processing chamber 150. In other embodiments, deposition of material and annealing of material can be performed in separate chambers.

As shown, the lid assembly 100 includes a showerhead 156 with holes 109, a blocker plate 140, a water cooling cover plate 134, a convolute liquid channel 162, a gas box plate 160, and a lid isolator 175. The lid assembly 100 is configured to deliver gas through the holes 109 onto the substrate 402 disposed below the showerhead 156. Water channels, such as a convolute liquid channel 162, are used to regulate the temperature of the lid assembly 100 during the vapor deposition process for depositing material. The lid assembly 100 is heated or maintained at a temperature within a range from about 100° C. to about 300° C., such as from about 125° C. to about 225° C., or from about 150° C. to about 200° C., according to at least one embodiment. The temperature can be maintained during the vapor deposition process of a cobalt-containing material, nickel containing material, or copper-containing material.

The showerhead 156 has a relatively short upwardly extending rim 158 coupled with the gas box plate 160. Both the showerhead 156 and the gas box plate 160 can be formed from or contain a metal, such as aluminum, stainless steel, or alloys thereof. The convolute liquid channel 162 is formed in the top of the gas box plate 160 and covered and sealed by the water cooling cover plate 134. Water is generally flown through the convolute liquid channel 162. However, alcohols, glycol ethers, and other organic solvents can be used solely or mixed with water to transfer heat away from or to the lid assembly 100. The convolute liquid channel 162 is formed in a serpentine though generally circumferential path having bends (e.g., three sharp U-turns or U-shaped bends) as the path progresses from the inside to the outside until the path returns to the inside in a radial channel (not shown). The convolute liquid channel 162 is narrow enough to ensure that the flow of water becomes turbulent, thus aiding the flow of heat from the flange of the gas box plate 160 to the water in the convolute liquid channel 162. A liquid temperature regulating system (not shown) may be attached to the convolute liquid channel 162 and used to transfer heat away from or to lid assembly 100. In one example, the lid assembly 100 is configured to be heated or maintained at a temperature of about 150° C. and is in fluid communication with a source of a cobalt precursor, such as dicobalt hexacarbonyl butylacetylene ($C_{12}H_{10}O_6Co$) (CCTBA), and a source of a hydrogen precursor, such as hydrogen gas ($H_2$).

The extending rim 158 of the showerhead 156 is attached to the bottom rim 171 of the gas box plate 160. Both the extending rim 158 and the bottom rim 171 are maximally sized between the encompassing lid isolator 175 and an encompassed lower cavity 130 of the showerhead 156. A screw fastening between the showerhead 156 and the gas box plate 160 ensures good thermal contact over the maximally sized contact area. The thermal flow area extends from the outside at the lid isolator 175 (except for a gap between the lid isolator 175 and either the showerhead 156 or the gas box plate 160) to the inside at a lower cavity 130. The structure of the convolute liquid channel 162 provides efficient thermal transfer between the water and the gas box plate 160. The mechanical interface between the flange of gas box plate 160 and showerhead 156 ensures efficient thermal transfer between the gas box plate 160 and the showerhead 156. Accordingly, cooling of the showerhead 156 is greatly enhanced.

The showerhead 156 has a plurality of apertures or holes 109 communicating between the lower cavity 130 and a processing region 126 to allow for the passage of processing gas. The processing gas is supplied through a gas port 132 formed at the center of the gas box plate 160 which is made of aluminum and is water-cooled. The upper side of the gas box plate 160 is covered by the water cooling cover plate 134 surrounding the upper portion of the gas box plate 160 that includes the gas port 132. The gas port 132 supplies the processing gases to an upper cavity 138 which is separated from the lower cavity 130 by a blocker plate 140. The blocker plate 140 has a large number of holes 109 disposed therethrough. In one implementation, the cavities 130 and 138, showerhead 156, and blocker plate 140 evenly distribute the processing gas over the upper face of the substrate 402.

The pedestal assembly 190 is configured to support a substrate 402 during processing of the substrate. As shown, the pedestal assembly 190 includes a heater pedestal 152, a pedestal stem 154, lift pins 118, a lifting ring 116, and a lift tube 117. The heater pedestal 152 is connected to the pedestal stem 154 that may be vertically moved within the processing chamber 150. The heater portion of the heater pedestal 152 can be formed of a ceramic material. In its upper deposition position, the heater pedestal 152 holds a substrate 402 in close opposition to a lower surface 107 of the showerhead 156. A processing region 126 is defined between the heater pedestal 152 and the lower surface 107 of the showerhead 156.

The substrate 402 is supported on the heater pedestal 152, which is illustrated in a raised, deposition position. In a lowered, loading position, the lifting ring 116 is attached to the lift tube 117 which lifts four lift pins 118. The lift pins 118 fit to slide into the heater pedestal 152 so that the lift pins 118 can receive the substrate 402 loaded into the chamber through a loadlock port 119 in the chamber body 120. The heater pedestal 152 can additionally include a confinement ring 110 for plasma-enhanced vapor deposition processes.

A side purge gas source 123 can be coupled to the processing chamber 150 and configured to supply purge gas to an edge portion 151 of the substrate 402 as needed. The purge gas can include $H_2$, argon gas (Ar), nitrogen gas ($N_2$), helium gas (He), combinations thereof, or the like. Furthermore, a bottom purge gas source 125 can also be coupled to the processing chamber 150 to supply the purge gas from the bottom of the processing chamber 150 to the substrate 402 surface. Similarly, the purge gas supplied from the bottom purge gas source 125 can include a $H_2$, Ar, $N_2$, He, combinations thereof, or the like.

The lid isolator 175 is interposed between the showerhead 156 and a lid rim 166, which can be lifted off the chamber body 120 to open the processing chamber 150 for maintenance access. The vacuum within the processing chamber 150 is maintained by a vacuum pump 170 connected to a pump plenum 172 within the processing chamber 150, which connects to an annular pumping channel 174.

A chamber liner 179 made of quartz is disposed in the processing chamber 150 which defines a side of the annular pumping channel 174, but also partially defines a further choke aperture 181 disposed between the processing region 126 and the annular pumping channel 174. The chamber liner 179 can have an annular shape. The chamber liner 179 also supports the confinement ring 110 in the lowered position of the heater pedestal 152. The chamber liner 179 also surrounds a circumference at the back of the heater pedestal 152. The chamber liner 179 rests on a narrow ledge in chamber body 120, but there is little other contact, so as to minimize thermal transport. Below the chamber liner 179 is located a lower chamber shield 121, made of opaque quartz. The lower chamber shield 121 can be a z-shaped chamber shield. The lower chamber shield 121 rests on the bottom of the chamber body 120 on an annular boss 177 formed on the bottom of the lower chamber shield 121. The quartz prevents radiative coupling between the bottom of the heater pedestal 152 and the chamber body 120. The annular boss 177 minimizes conductive heat transfer to the chamber body 120. The lower chamber shield 121 includes an inwardly extending bottom lip joined to a conically shaped upper portion conforming to the inner wall of chamber body 120, according to some embodiments.

A remote plasma source 141 is coupled to the processing chamber 150 through a gas port 132 to supply reactive plasma from the remote plasma source 141 through the plurality of holes 109 in the showerhead 156 to the processing chamber 150 to the substrate 402 surface. It is noted that the remote plasma source 141 may be coupled to the processing chamber 150 in any suitable position to supply a reactive remote plasma source to the substrate 402 surface as needed. Suitable gases that may be supplied to the remote plasma source 141 to be dissociated and further delivered to the substrate 402 surface include $H_2$, $N_2$, Ar, He, ammonia ($NH_3$), combinations thereof, and the like.

The control unit 180 is configured to control the various components of the processing chamber 150. The control unit can be one of any form of a general purpose computer processor that can be used in an industrial setting for controlling various chambers and sub-processors. As shown, the control unit 180 includes a central processing unit (CPU) 182, support circuitry 184, and memory 186. The CPU 182 can use any suitable memory 186, such as random access memory, read only memory, floppy disk drive, compact disc drive, hard disk, or any other form of digital storage, local or remote. Various support circuits may be coupled to the CPU 182 for supporting the processing chamber 150. The control unit 180 can be coupled to another controller that is located adjacent individual chamber components. Bi-directional communications between the control unit 180 and various other components of the processing chamber 150 are handled through numerous signal cables collectively referred to as signal buses. The control unit 180 can also be configured to control various chambers of a multi-chamber processing system 200 as described below in FIG. 2.

Figure 1B:
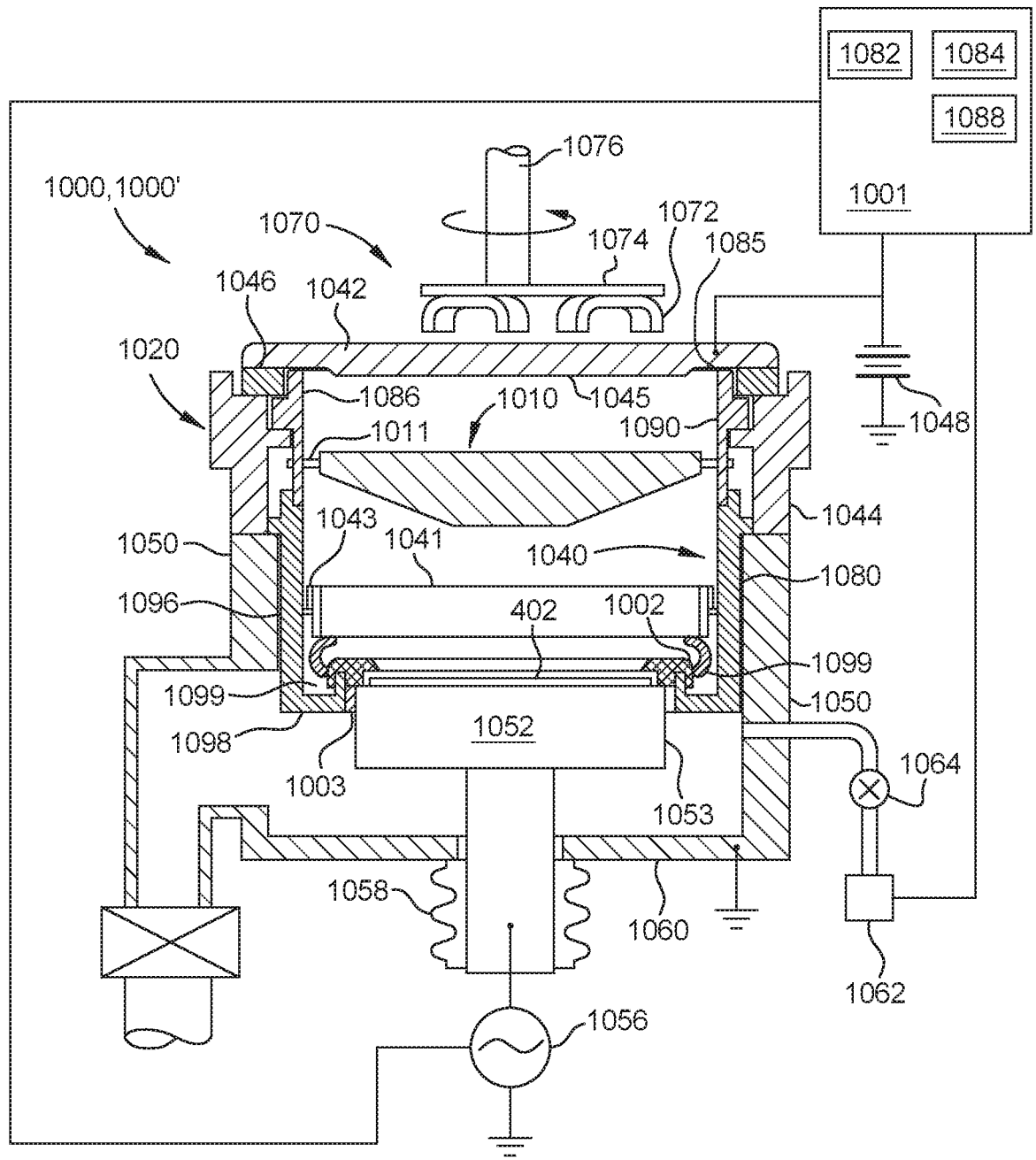
FIG. 1B illustrates a schematic side view of a processing chamber, according to at least one embodiment.

FIG. 1B illustrates a processing chamber 1000, according to at least one embodiment. The processing chamber 1000 is configured to sputter material onto a substrate. The processing chamber 1000 is a physical vapor deposition (PVD) chamber, capable of depositing, for example, titanium, aluminum oxide, aluminum, copper, tantalum, tantalum nitride, tungsten, or tungsten nitride on a substrate, according to at least one embodiment. Examples of suitable PVD chambers include the ALPS® Plus and SIP ENCORE® PVD processing chambers, both commercially available from Applied Materials, Inc., Santa Clara, of Calif. It is contemplated that processing chambers available from other manufactures may also be utilized to perform the embodiments described herein. As shown, the processing chamber 1000 includes a target 1042, a substrate support pedestal 1052, a magnetron 1070, a process kit 1040, a control unit 1001, and a body 1020.

The target 1042 is configured to deposit material on the substrate 402. As shown, the target 1042 has a sputtering surface 1045. The target 1042 is supported by a grounded adapter 1044 through a dielectric isolator 1046. The target 1042 includes the material to be deposited on the substrate 1054 surface during sputtering, and can include copper for depositing as a seed layer in high aspect ratio features formed in the substrate 402. The target 1042 also includes a bonded composite of a metallic surface layer of sputterable material, such as copper, and a backing layer of a structural material, such as aluminum, according to at least one embodiment. The target 1042 can also include other materials, such as Ta, Nb, V, Cu, or manganese (Mn).

The substrate support pedestal 1052 is configured to support a substrate 402. As shown, the substrate support pedestal 1052 has a peripheral edge 1053. The substrate support pedestal 1052 can be located within a grounded chamber wall 1050. The substrate support pedestal 1052 supports the substrate 402 having high aspect ratio features to be sputter coated, the bottoms of which are in planar opposition to a principal surface of the target 1042. The substrate support pedestal 1052 has a planar substrate-receiving surface disposed generally parallel to the sputtering surface of the target 1042. The substrate support pedestal 1052 can be vertically movable through a bellows 1058 connected to a bottom wall 1060 of the processing chamber 1000 to allow the substrate 402 to be transferred onto the substrate support pedestal 1052 through a load lock valve (not shown) in a lower portion of the processing chamber 1000. The substrate support pedestal 1052 can then be raised to a deposition position, as illustrated in FIG. 1B.

Processing gas can be supplied from a gas source 1062 through a mass flow controller 1064 into the lower portion of the processing chamber 1000. A direct current (DC) power source 1048, coupled to the processing chamber 1000, is used to apply a negative voltage or bias to the target 1042, according to at least one embodiment. A radio frequency (RF) power source 1056 can be coupled to the substrate support pedestal 1052 to induce a DC self-bias on the substrate 402. The substrate support pedestal 1052 is grounded, according to at least one embodiment. The substrate support pedestal 1052 is electrically floated, according to at least one embodiment.

The magnetron 1070 is configured to provide a magnetic field to the target 1042 to sputter material of the target onto the substrate 402 below. As shown, the magnetron 1070 includes a plurality of magnets 1072, a base plate 1074, and a shaft 1076. The magnetron 1070 is positioned above the target 1042. The plurality of magnets 1072 is supported by the base plate 1074 connected to the shaft 1076, which may be axially aligned with the central axis of the processing chamber 1000 and the substrate 402. The plurality of magnets 1072 are aligned in a kidney-shaped pattern, according to at least one embodiment. The plurality of magnets 1072 produce a magnetic field within the processing chamber 1000 near the front face of the target 1042 to generate plasma, such that a significant flux of ions strike the target 1042, causing sputter emission of target material. The plurality of magnets 1072 can be rotated about the shaft 1076 to increase uniformity of the magnetic field across the surface of the target 1042. The magnetron 1070 can be a small magnet magnetron. The magnets 1072 can be both rotated and moved reciprocally in a linear direction substantially parallel to the face of the target 1042 to produce a spiral motion. The magnets 1072 can be rotated about both a central axis and an independently-controlled secondary axis to control both their radial and angular positions.

The process kit 1040 is configured to protect various components of the processing chamber 1000 from unwanted sputtering from the target 1042. As shown, the process kit 1040 includes a lower shield 1080, a one-piece upper shield 1086, and a collimator 1010. The lower shield 1080 has a support flange supported by and electrically coupled to the chamber wall 1050. The lower shield 1080 can include multiple pieces, or the lower shield can be one piece. The lower shield 1080 can be grounded. The upper shield 1086 is supported by and electrically coupled to a flange of the adapter 1044. The upper shield 1086 and the lower shield 1080 are electrically coupled, as are the adapter 1044 and the chamber wall 1050. Both the upper shield 1086 and the lower shield 1080 can include stainless steel. The processing chamber 1000 can include a middle shield (not shown) coupled to the upper shield 1086. In one embodiment, the upper shield 1086 and the lower shield 1080 are electrically floating within the processing chamber 1000. In one embodiment, the upper shield 1086 and the lower shield 1080 are coupled to an electrical power source.

In one embodiment, the upper shield 1086 has an upper portion that closely fits an annular side recess of the target 1042 with a narrow gap 1085 between the upper shield 1086 and the target 1042, which is sufficiently narrow to prevent plasma from penetrating and sputter coating the dielectric isolator 1046. The upper shield 1086 may also include a downwardly projecting tip 1090, which covers the interface between the lower shield 1080 and the upper shield 1086, preventing them from being bonded by sputter deposited material.

The lower shield 1080 extends downwardly into a cylindrical outer band 1096, which generally extends along the chamber wall 1050 to below the top surface of the substrate support pedestal 1052. The lower shield 1080 has a base plate 1098 extending radially inward from the cylindrical outer band 1096. The base plate 1098 includes an upwardly extending cylindrical inner band 1003 surrounding the perimeter of the substrate support pedestal 1052. A cover ring 1002 rests on the top of the cylindrical inner band 1003 when the substrate support pedestal 1052 is in a lower/loading position and rests on the outer periphery of the substrate support pedestal 1052 when the pedestal is in an upper/deposition position to protect the substrate support pedestal 1052 from sputter deposition.

The lower shield 1080 encircles the sputtering surface 1045 of the target 1042 that faces the substrate support pedestal 1052 and also encircles a peripheral wall of the substrate support pedestal 1052. The lower shield 1080 covers and shadows the chamber wall 1050 of the processing chamber 1000 to reduce deposition of sputtering deposits originating from the sputtering surface 1045 of the target 1042 onto the components and surfaces behind the lower shield 1080. For example, the lower shield 1080 can protect the surfaces of the substrate support pedestal 1052, portions of the substrate 402, the chamber wall 1050, and the bottom wall 1060 of the processing chamber 1000.

The collimator 1010 is configured to trap ions and neutrals that are emitted from the target 1042 at angles exceeding a selected angle, near normal to the substrate 402. Directional sputtering is achieved by positioning the collimator 1010 between the target 1042 and the substrate support pedestal 1052. The collimator 1010 is mechanically and electrically coupled to the upper shield 1086. The collimator 1010 is attached to the upper shield 1086 by a plurality of radial brackets 1011. In one embodiment, the collimator 1010 is coupled to a middle shield (not shown), positioned lower in the processing chamber 1000. In one embodiment, the collimator 1010 is integral to the upper shield 1086. In one embodiment, the collimator 1010 is welded to the upper shield 1086. In one embodiment, the collimator 1100 is electrically floating within the processing chamber 1000. In one embodiment, the collimator 1010 is coupled to an electrical power source. The collimator 1010 includes a plurality of apertures (omitted from FIG. 1) to direct gas and/or material flux within the chamber. The operation of the processing chamber 1000 and the function of the collimator 1010 are similar regardless of the exact shape of the radial decreasing aspect ratio of the collimator 1010.

The control unit 1001 is configured to control the various components of the processing chamber 1000. The control unit 1001 can be one of any form of a general purpose computer processor that can be used in an industrial setting for controlling various chambers and sub-processors. As shown, the control unit 1001 includes a central processing unit (CPU) 1082, support circuitry 1084, and memory 1088. The CPU 1082 can use any suitable memory 1088, such as random access memory, read only memory, floppy disk drive, compact disc drive, hard disk, or any other form of digital storage, local or remote. Various support circuits may be coupled to the CPU 1082 for supporting the processing chamber 1000. The control unit 1001 can be coupled to another controller that is located adjacent individual chamber components. Bi-directional communications between the control unit 1001 and various other components of the processing chamber 1000 are handled through numerous signal cables collectively referred to as signal buses. The control unit 1001 can also be configured to control various chambers of a multi-chamber processing system 200 as described below in FIG. 2. The control unit 1001 can also control the processing chamber 150 described above.

In one embodiment, the control unit 1001 provides signals to position the substrate 402 on the substrate support pedestal 1052 and generate plasma in the processing chamber 1000. The control unit 1001 sends signals to apply a voltage via the DC power source 1048 to bias the target 1042 and to excite processing gas, such as argon, into plasma. The control unit 1001 further provides signals to cause the RF power source 1056 to DC self-bias the substrate support pedestal 1052. The DC self-bias attracts positively charged ions created in the plasma deeply into high aspect ratio vias and trenches on the surface of the substrate 402.

Additionally, in order to provide even greater coverage of sputter deposited material onto the bottom and side walls of high aspect ratio features, material sputter deposited onto the field and bottom regions of features may be sputter etched. In one embodiment, the control unit 1001 applies a high bias to the substrate support pedestal 1052 such that the target 1042 ions etch film already deposited on the substrate 1054. As a result, the field deposition rate onto the substrate 1054 is reduced, and the sputtered material re-deposits on either the side walls or bottom of the high aspect ratio features. In one embodiment, the control unit 1001 applies high and low bias to the substrate support pedestal 1052 in a pulsing, or alternating fashion such that the process becomes a pulsing deposit/etch process. In one embodiment, the collimator 1010 cells specifically located below magnets 1072 direct the majority of the deposition material toward the substrate 1054. Therefore, at any particular time, material in one region of the substrate 402 is deposited, while material already deposited in another region of the substrate 402 is etched.

In one embodiment, to provide even greater coverage of sputter deposited material onto the side walls of high aspect ratio features, material sputter deposited onto the bottom of the features may be sputter etched using secondary plasma, such as argon plasma, generated in a region of the processing chamber 1000 near the substrate 402. The processing chamber 1000 includes a coil 1041 attached to the lower shield 1080 by a plurality of coil standoffs 1043, which electrically insulate the coil 1041 from the lower shield 1080. The control unit 1001 sends signals to apply RF power through the shield 1080 to the coil 1041 via feedthrough standoffs (not shown). In one embodiment, the coil 1041 inductively couples RF energy into the interior of the processing chamber 1000 to ionize precursor gas, such as argon, to maintain secondary plasma near the substrate 1054. The secondary plasma resputters a deposition layer from the bottom of a high aspect ratio feature and redeposits the material onto the side walls of the feature. The coil 1041 can include any metal, including Cu, Ta, V, Nb, or combinations thereof.

In addition, in some embodiments, the processing chamber 1000 includes one or more lamps 1099. The one or more lamps 1099 provide heat to the substrate 402. In these embodiments, the processing chamber is identified by the index 1000'.

Figure 2:
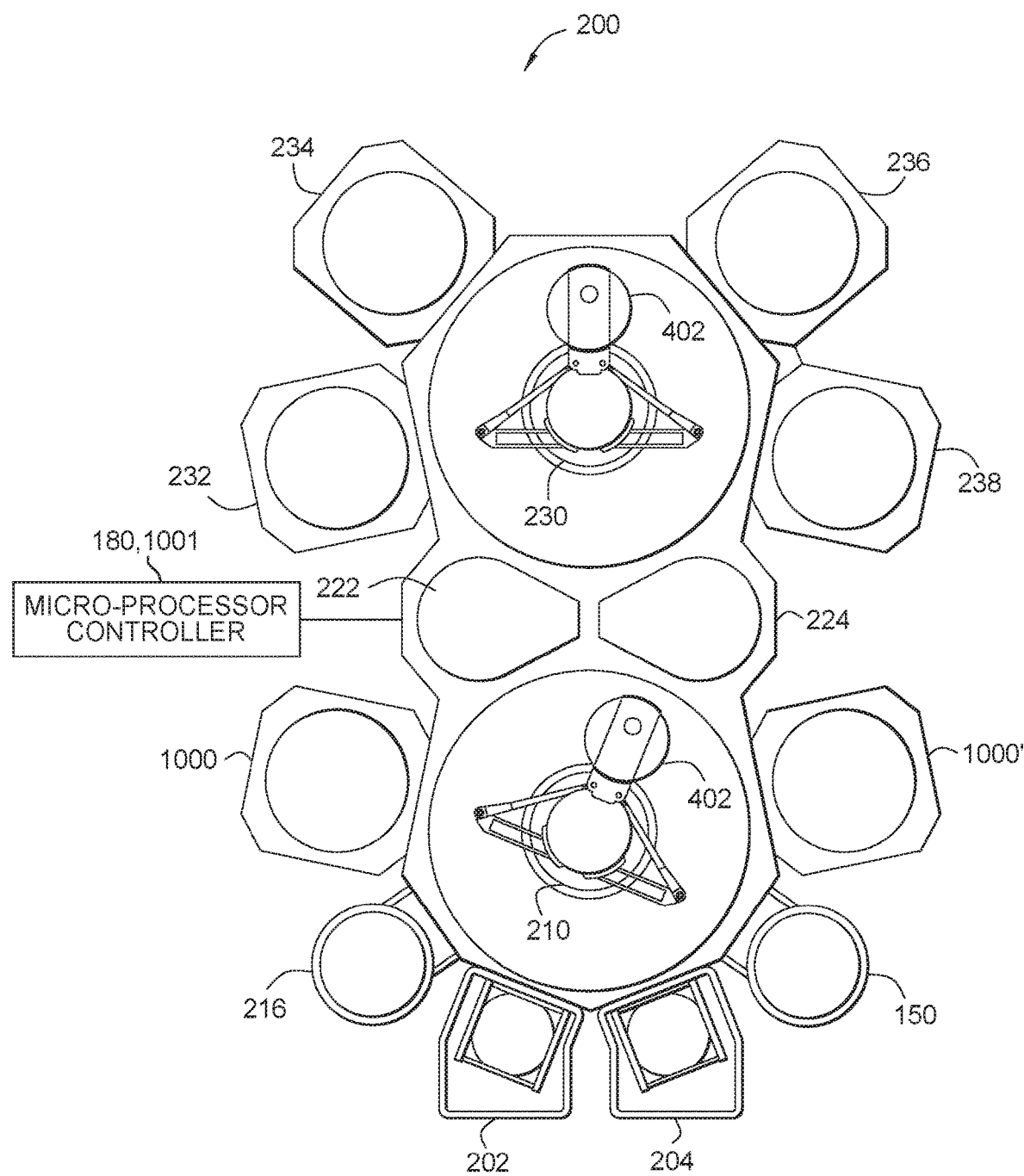
FIG. 2 illustrates a schematic top view of a multi-chamber processing system, according to at least one embodiment.

FIG. 2 illustrates a schematic top view of a multi-chamber processing system 200, according to at least one embodiment. The multi-chamber processing system is configured to perform deposition processes as disclosed herein having a processing chamber 150, 1000, 1000' as described above in reference to FIGS. 1A-1B, integrated therewith. As shown, the multi-chamber processing system 200 includes load lock chambers 202, 204, processing chambers 1000, 1000', 150, 216, 232, 234, 236, 238, robots 210, 230, and transfer chambers 222, 224.

The load lock chambers 202, 204 are configured to transfer substrate 402 into and out of the multi-chamber processing system 200. Generally, the multi-chamber processing system 200 is maintained under vacuum and the load lock chambers 202 and 204 can be "pumped down" to introduce substrate 402 introduced into the multi-chamber processing system 200. The first robot 210 transfers the substrate 402 between the load lock chambers 202 and 204, and a first set of one or more processing chambers 1000, 1000', 216, and 150. Each processing chamber 1000, 1000', 216, and 150 is configured to be at least one of a substrate deposition process, such as cyclical layer deposition (CLD), atomic layer deposition (ALD), chemical vapor deposition (CVD), physical vapor deposition (PVD), etch, degas, pre-cleaning orientation, anneal, electrochemical plating (ECP), and other substrate processes. Furthermore, one of the processing chambers 1000, 1000', 216, and 150 can be configured to perform a pre-clean process prior to performing a deposition process or a thermal annealing process on the substrate 402. The position of the processing chamber 150 relative to the other processing chambers 1000, 1000', 216 is for illustration, and the position of the processing chamber 150 can optionally be switched with any one of the processing chambers 1000, 1000', 216 if desired.

The first robot 210 can also transfer the substrate 402 to/from one or more transfer chambers 222 and 224. The transfer chambers 222 and 224 can be used to maintain ultrahigh vacuum conditions while allowing substrate 402 to be transferred within the multi-chamber processing system 200. A second robot 230 can transfer the substrate 402 between the transfer chambers 222 and 224 and a second set of one or more processing chambers 232, 234, 236 and 238. Similar to the processing chambers 1000, 1000', 216, and 150, the processing chambers 232, 234, 236, and 238 can be outfitted to perform a variety of substrate processing operations including the dry etch processes described herein in addition to cyclical layer deposition (CLD), atomic layer deposition (ALD), chemical vapor deposition (CVD), physical vapor deposition (PVD), etch, pre-clean, degas, and orientation, for example. Any of the processing chambers 1000, 1000', 216, 232, 234, 236, and 238 can be removed from the multi-chamber processing system 200 if not necessary for a particular process to be performed by the multi-chamber processing system 200. After the preclean, deposition and/or a thermal annealing process is performed in the processing chamber 150, the substrate may further be transferred to any of the processing chambers 1000, 1000', 216, 232, 234, 236, and 238 of the system 200 to perform other process as needed.

Figure 3:
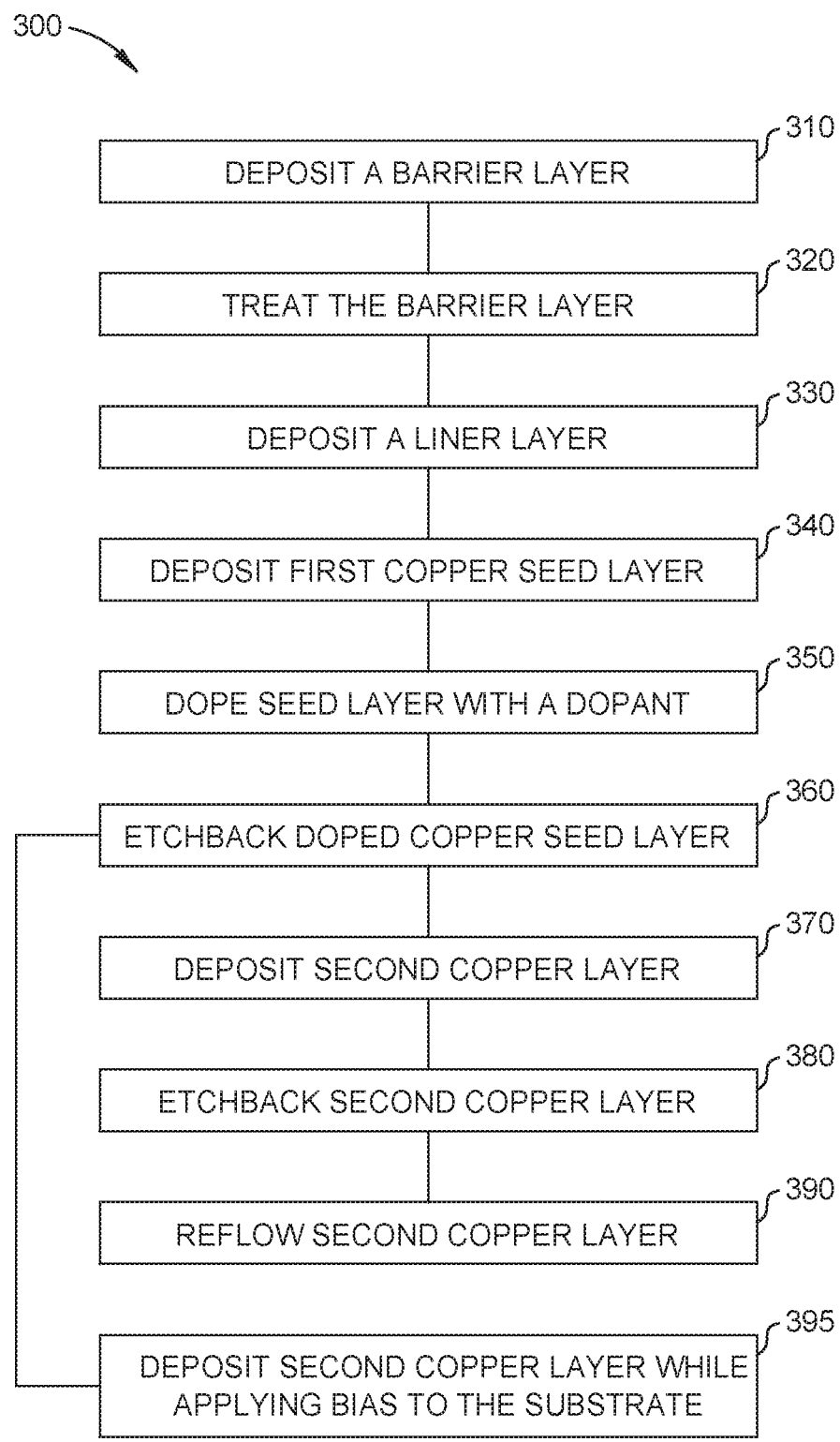
FIG. 3 is a flow diagram of method operations for depositing a plurality of layers, according to at least one embodiment.

FIG. 3 is a flow diagram of method 300 operations for depositing a plurality of layers in a device structure 408 (FIG. 4A), according to at least one embodiment. FIGS. 4A-4J illustrate a schematic side view of a device structure 408 during various operations of the method 300 of FIG. 3, according to at least one embodiment. The plurality of layers can include any of the layers deposited as described in the method 300 below. Although the method 300 operations are described in conjunction with FIGS. 3 and 4A-4J, persons skilled in the art will understand that any system configured to perform the method operations, in any order, falls within the scope of the embodiments described herein. Any of the method 300 operations can be performed in any of the chambers of the multi-chamber processing system 200, such as processing chamber 150, 1000, 1000', or in any other suitable chamber. In addition, different operations of the method 300 can be performed in different chambers within the multi-chamber processing system 200, or in any other suitable chamber.

Figure 4A:
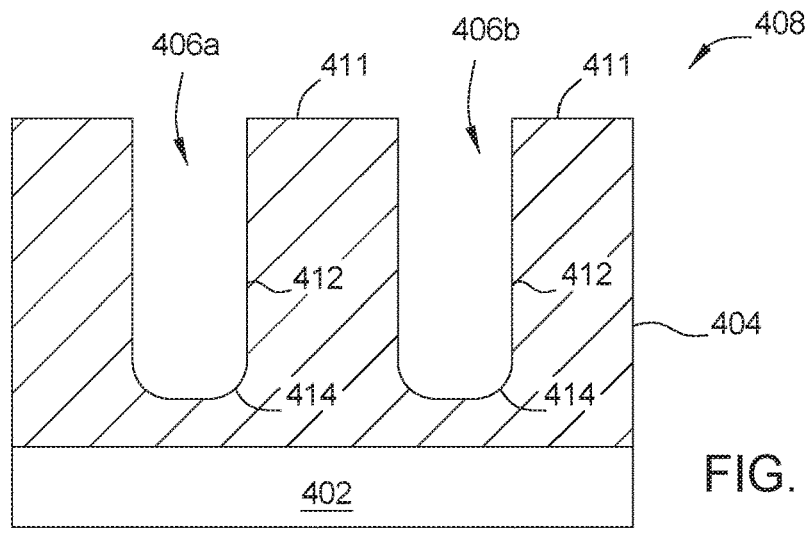
FIGS. 4A-4J illustrate a schematic side view of a device structure during various operations of the method of FIG. 3, according to at least one embodiment.

FIG. 4A illustrates a schematic side view of a device structure 408, according to at least one embodiment. The device structure 408 can be used for three-dimensional (3-D) flash memory applications, DRAM applications, or other suitable applications with high aspect ratio or other odd geometries. As shown, the device structure 408 includes a layer 404 disposed over the substrate 402. The layer 404 can include any suitable layers such as a single silicon (Si) layer, high-k dielectric layer, low-k dielectric layer, or a multiple layer film stack having at least one of the aforementioned layers formed therein. The layer 404 is in the form of a single layer, and the layer 404 can be a silicon oxide ($SiO_2$) layer, an oxide layer, a silicon nitride layer ($Si_3N_4$), a nitride layer, a silicon oxynitride (SiON) layer, a titanium nitride (TiN) layer, a polysilicon layer, a microcrystalline silicon layer, a monocrystalline silicon layer, a doped polysilicon layer, a doped microcrystalline silicon layer, or a doped monocrystalline silicon layer, according to some embodiments.

Layer 404 is a Si containing layer, and the layer 404 is a film stack including a composite oxide and nitride layer, at least one or more oxide layers sandwiching a nitride layer, and combinations thereof, according to some embodiments. Suitable dopants doped in the Si containing layer 404 may include p-type dopants and n-type dopants, such as boron (B) containing dopants or phosphine (P) containing dopants. The layer 404 includes repeating pairs of layers, including a Si containing layer and a dielectric layer, according to at least one embodiment. The layer 404 includes a polysilicon layer and/or other metal materials and/or a dielectric layer disposed therein, according to some embodiments. Suitable examples of the dielectric layer includes a $SiO_2$ layer, an oxide layer, a $Si_3N_4$ layer, a nitride layer, a SiON layer, a TiN layer, a composite of oxide and nitride layer, at least one or more oxide layers sandwiching a nitride layer, and combinations thereof, among others.

The layer 404 has a surface 411 and feature definitions 406a, 406b formed therein with high aspect ratios, such as aspect ratios greater than 4:1, for example about greater than 6:1. The feature definitions 406a, 406b are formed in the device structure 408 and have side walls 412 and a bottom 414 which form an open channel to expose the underlying layer 404.

Figure 4B:
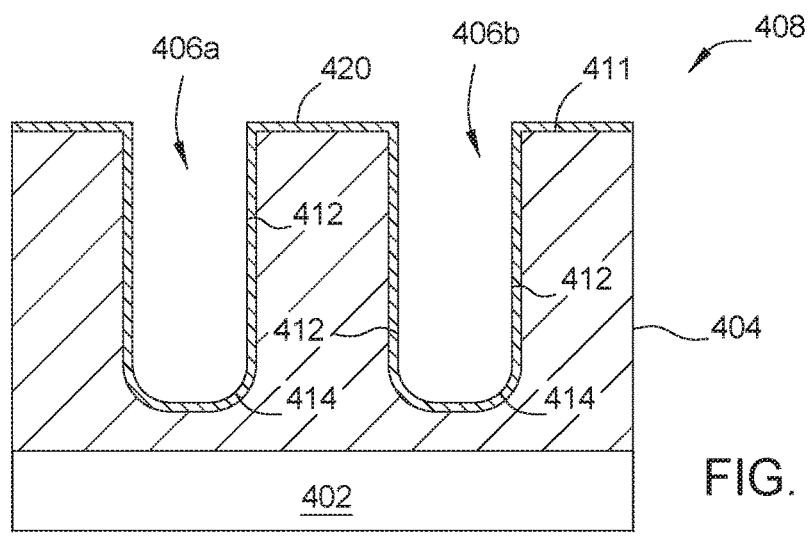

The method 300 begins at operation 310, where a barrier layer 420 is deposited on the device structure 408, such that the barrier layer substantially lines the side walls 412 and the bottom 414 of the feature definitions 406a, 406b. FIG. 4B illustrates the device structure 408 with the barrier layer 420, according to at least one embodiment. The barrier layer 420 protects the underlying material of the layer 404 from being damaged by additional method operations of method 300. In addition, the barrier layer 420 prevents movement of atoms in the eventually deposited copper layer from migrating into the layer 404. The barrier layer 420 includes a metal nitride, such as TiN or tantalum nitride (TaN), according to at least one embodiment. The barrier layer 420 is deposited using any suitable film deposition method, such as ALD.

According to at least one embodiment, the barrier layer 420 includes TaN, the barrier layer has a thickness of about 15 ∈, the barrier layer is deposited using ALD using precursors pentakis dimethylamino tantulum (PDMAT) [Ta $(N(CH_3)_2)_5$]] and ammonia ($NH_3$), and the deposition is performed for about 115 seconds to about 150 seconds at a temperature of about 225° C. to about 325° C.

Figure 4C:
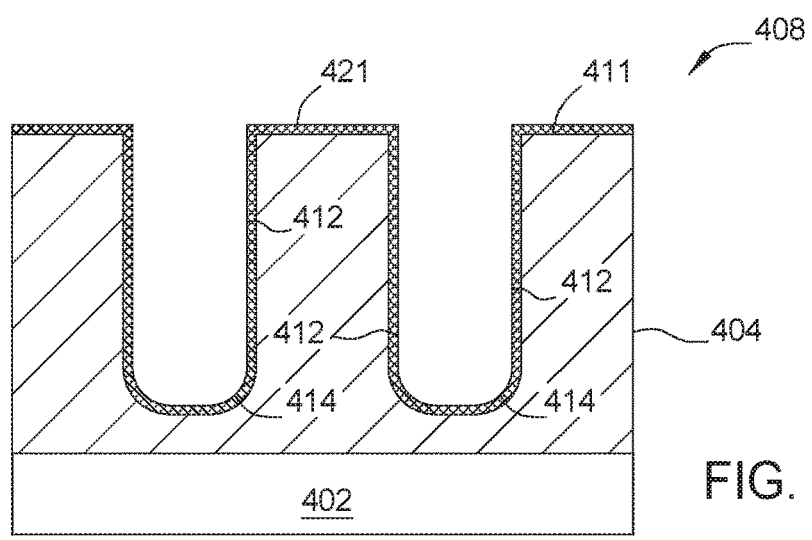

At operation 320, the barrier layer 420 is modified by a treatment process to become a treated barrier layer 421. FIG. 4C illustrates the device structure 408 with the treated barrier layer 421, according to at least one embodiment. The treated barrier flayer 421 has increased density and purity and reduced resistivity in comparison to the barrier layer 420. The treatment process includes a PVD process, according to at least one embodiment. The PVD process uses a target such as target 1042 described above. The target can include the material to treat the barrier layer 420, such as tantalum (Ta), titanium (Ti), niobium (Nb), cobalt (Co), copper (Cu), and aluminum (Al). Operation 320 is performed in a first processing chamber 150, according to at least one embodiment.

According to at least one embodiment, the treated barrier layer 421 includes TaN, the modified barrier layer has a thickness of about 15 Å, the modified barrier layer is treated using PVD using a target including Ta and an inductively coupled Ta coil, and the deposition is performed for about 2 seconds at a temperature of about 275° C. to about 325° C.

Figure 4D:
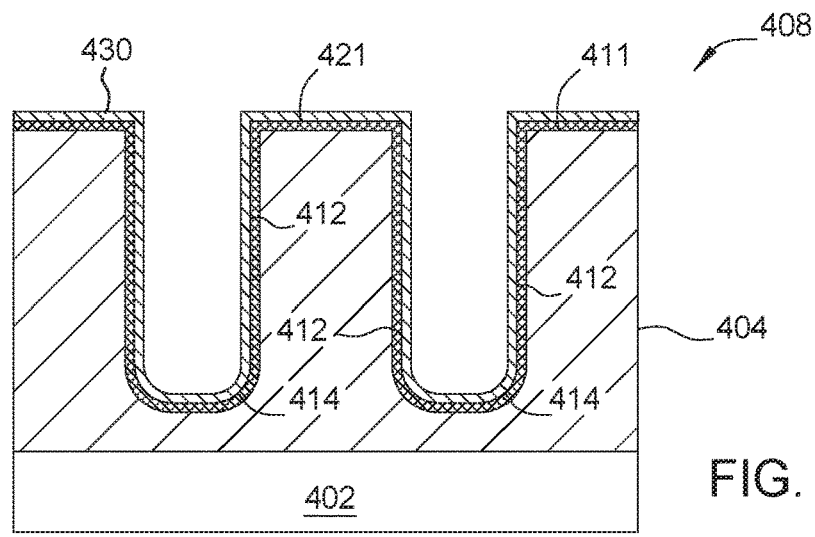

At operation 330, a liner layer 430 is deposited on the treated barrier layer 421. FIG. 4D illustrates the device structure 408 with the liner layer 430, according to at least one embodiment. The liner layer 430 improves the adhesion of the eventually deposited copper layer. The liner layer 430 includes a metal, such as Co, according to at least one embodiment. The liner layer 430 may include a metal nitride. The liner layer 430 is deposited by any suitable method, such as, for example, CVD.

According to at least one embodiment, the liner layer 430 includes Co, the liner layer has a thickness of about 20 Å, the liner layer is deposited using CVD using precursors CCTBA and $H_2$, and the deposition is performed for about 100 seconds to about 200 seconds at a temperature of about 150° C. to about 200° C.

Figure 4E:
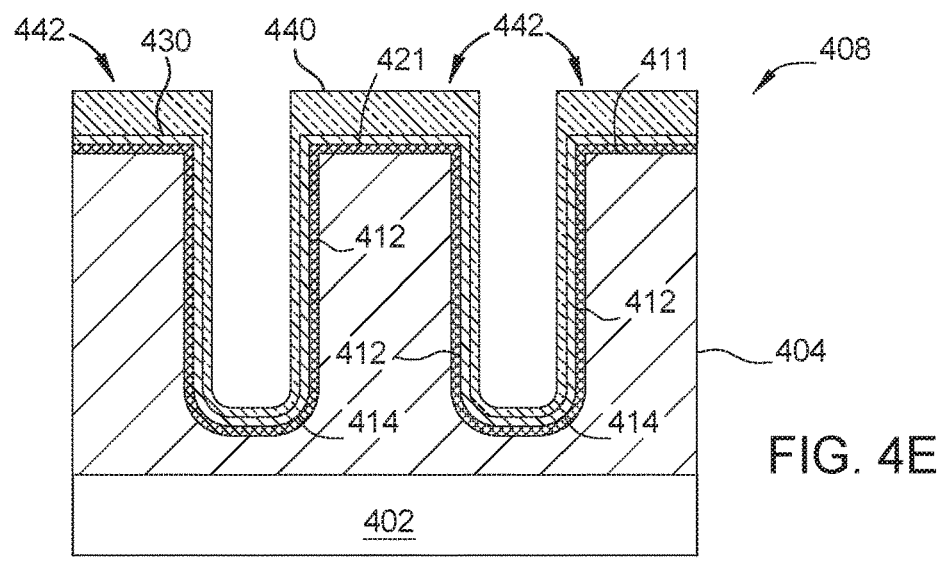

At operation 340, a first copper seed layer 440 is deposited on the liner layer 430. FIG. 4E illustrates the device structure 408 with the first copper seed layer 440, according to at least one embodiment. The first copper seed layer 440 includes one or more seed layer portions 442. The first copper seed layer 440 is deposited by any suitable method, such as PVD. The first copper seed layer 440 is deposited by PVD using a coil, such as coil 1041, and the coil includes Cu, and using a target, such as the target 1042, and the target includes Cu, according to at least one embodiment. Operation 340 is performed in a second processing chamber 1000, according to at least one embodiment. Operation 340 is performed in a third processing chamber 1000', according to at least one embodiment.

According to at least one embodiment, the first copper seed layer 440 has a thickness of about 60 Å, the first copper seed layer is deposited using PVD using a Cu target and a Cu coil, and the deposition is performed for about 5 seconds to about 10 seconds at room temperature (e.g., about 23° C.).

According to another embodiment, the first copper seed layer 440 has a thickness of about 75 Å, the first copper seed layer is deposited using PVD using a Cu target and a Cu coil, and the deposition is performed for about 7 seconds to about 13 seconds at room temperature.

Figure 4F:
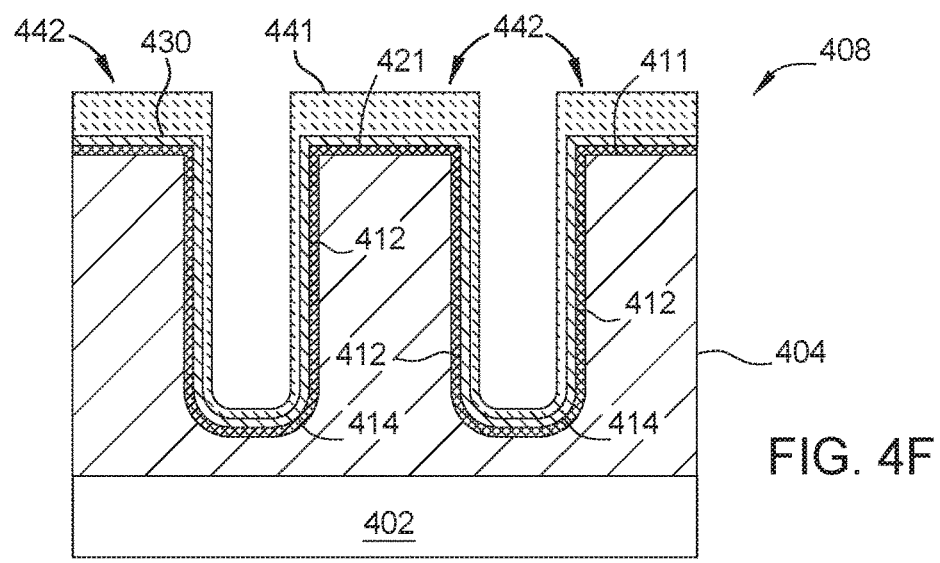

At operation 350, the first copper seed layer 440 is treated with a dopant to become a doped copper seed layer 441. FIG. 4F illustrates the device structure 408 with the doped copper seed layer 441, according to at least one embodiment. The dopant increases the flowability of the deposited copper seed layer and subsequent deposited copper layers. The dopant includes any dopant used to increase flowability of Cu. The dopant includes tantalum (Ta), vanadium (V), niobium (Nb), or combinations thereof, according to some embodiments. The dopant is deposited in any suitable manner, such as a PVD reaction.

The doped copper seed layer 441 is pinned down by the dopants, which reduces unwanted agglomeration of copper on the side walls 412. The dopant concentration should remain low, such that the dopant atoms are located relatively isolated from one another, in order to prevent the clustering of dopant atoms or an alloy of the dopant and Cu to form. In addition, the dopant concentration should not increase the resistivity of the doped copper seed layer 441 by too large an amount, or else the doped copper seed layer will not perform reliably as a conducting material. The doped copper seed layer 441 has an atomic ratio from about 3% to about 6% of dopant atoms to Cu atoms, according to at least one embodiment. Operation 350 is performed in the first processing chamber 150, according to at least one embodiment.

According to some embodiments, doping the first copper seed layer 440 includes using PVD using a target including Ta and using a Ta coil, and the doping is performed for about 2 seconds at a temperature of about room temperature to about 325° C.

Figure 4G:
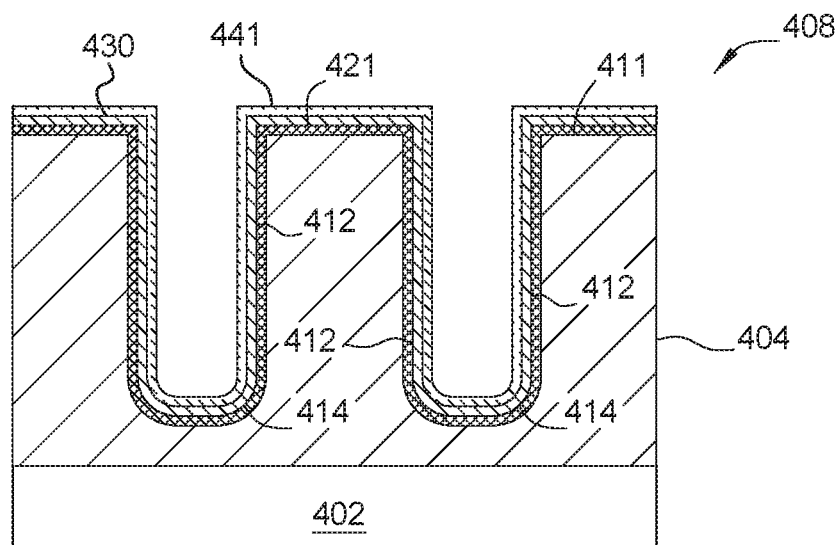

At operation 360, the doped copper seed layer 441 is etched back. FIG. 4G illustrates the device structure 408 with the doped copper seed layer 441 after the etchback is performed, according to at least one embodiment. The etchback removes unwanted portions of the doped copper seed layer 441. For example, the etchback removes one or more seed layer portions 442 (shown in FIG. 4E) of the doped copper seed layer 441 disposed over the surface 411. The etchback can be performed in the presence of a gas, such as argon gas (Ar). The etchback can be performed in the presence of a coil, such as the coil 1041. The coil contains Ta, further doping the doped copper seed layer 441, according to at least one embodiment. Operation 360 is performed in the second processing chamber 1000, according to at least one embodiment. Operation 360 is performed in the third processing chamber 1000', according to at least one embodiment.

According to some embodiments, etching back the doped copper seed layer 441 includes removing about 55% of the doped copper seed layer, the etchback includes exposing the doped copper seed layer to Ar, and the etchback is performed for about 5 seconds to about 10 seconds at room temperature.

Figure 4H:
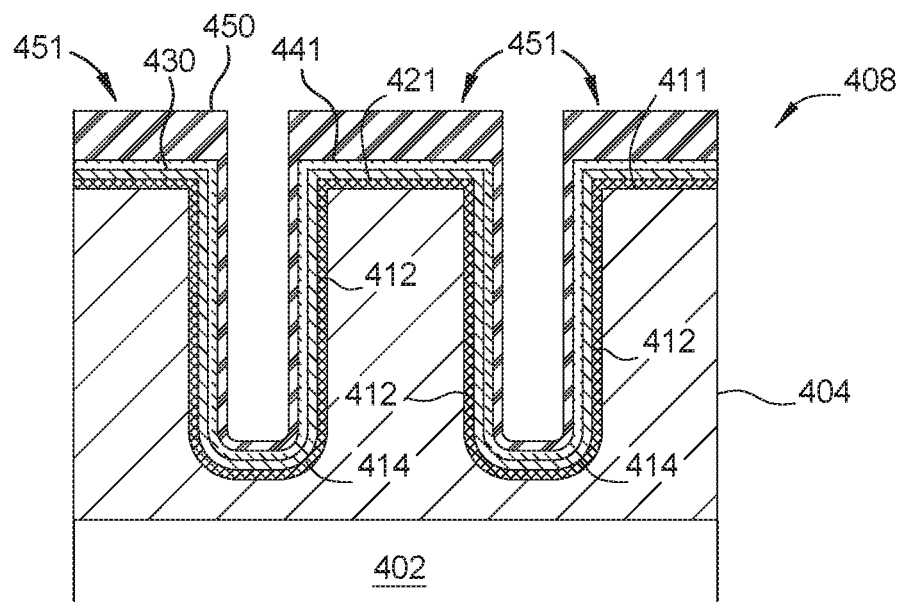

At operation 370, a second copper layer 450 is deposited on the doped copper seed layer 441. FIG. 4H illustrates the device structure 408 with the second copper layer 450, according to at least one embodiment. The second copper layer 450 can be deposited similarly to operation 340 described above. The second copper layer 450 does not include Ta, Nb, or V dopants, according to at least one embodiment. Operation 370 is performed in the second processing chamber 1000, according to at least one embodiment. Operation 370 is performed in the third processing chamber 1000', according to at least one embodiment.

According to at least one embodiment, the second copper layer 450 has a thickness of about 60 Å, the second copper seed layer is deposited using PVD using a Cu target and a Cu coil, and the deposition is performed for about 6 seconds to about 10 seconds at room temperature.

According to another embodiment, the second copper seed layer 450 has a thickness of about 75 Å, the second copper seed layer is deposited using PVD using a Cu target and a Cu coil, and the deposition is performed for about 7 seconds to about 13 seconds at room temperature.

Figure 4I:
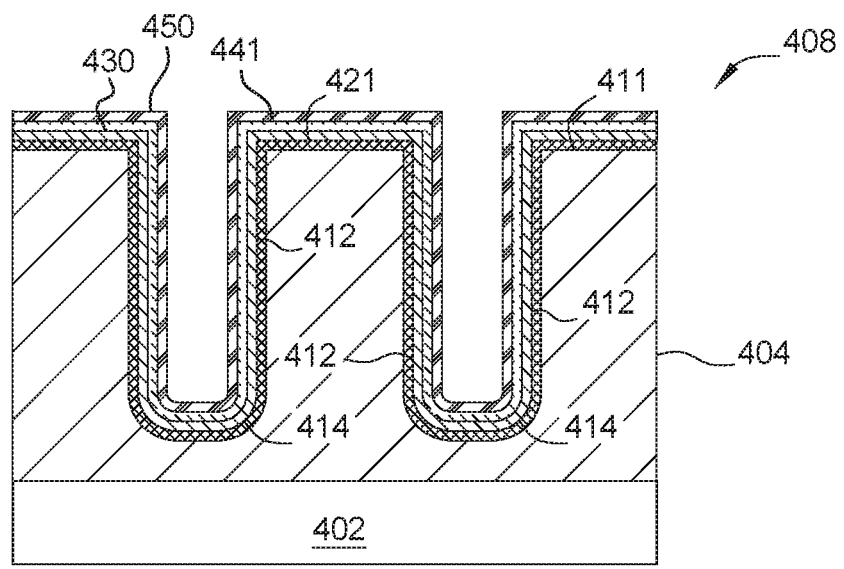

At operation 380, the second copper layer 450 is etched back. FIG. 4I illustrates the device structure 408 with the second copper layer 450 after the etchback is performed, according to at least one embodiment. The etchback removes unwanted portions of the second copper layer 450. For example, the etchback removes one or more copper layer portions 451 (shown in FIG. 4H) of the second copper layer 450 disposed over the surface 411. Operation 380 is performed in the second processing chamber 1000, according to at least one embodiment. Operation 380 is performed in the third processing chamber 1000', according to at least one embodiment.

According to some embodiments, etching back the second copper layer 450 includes removing about 55% of the second copper layer, the etchback includes exposing the second copper layer to Ar, and the etchback is performed for about 5 seconds to about 10 seconds at room temperature.

Figure 4J:
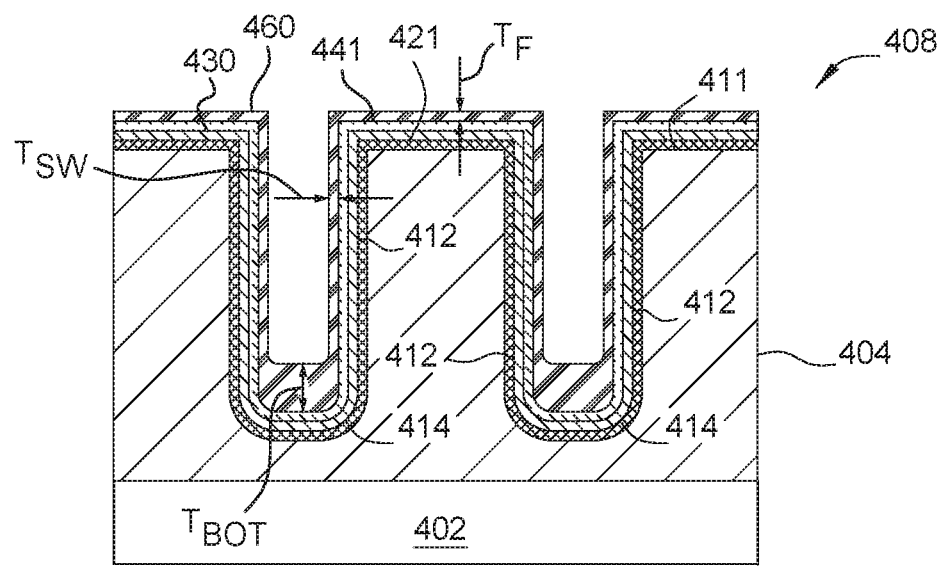

At operation 390, the doped copper seed layer 441 and the second copper layer 450 are reflowed to create a combined copper layer 460. FIG. 4J illustrates the device structure 408 with the combined copper layer 460, according to at least one embodiment. The combined copper layer 460 has a thickness profile including a sidewall thickness $T_{SW}$, a field thickness $T_F$, and a bottom thickness $T_{Bot}$. After the reflowing of operation 390, the sidewall thickness $T_{SW}$ is approximately equal to the field thickness $T_F$, and the bottom thickness $T_{Bot}$ is greater than the sidewall thickness $T_{SW}$, according to at least one embodiment. In addition, in some embodiments, operations 370, 380, 390 are repeated additional times, until the combined copper layer 460 has the desired thickness profile. The reflow procedure can include annealing the doped copper seed layer 441 and the second copper layer 450. Operation 390 is performed in the second processing chamber 1000, according to at least one embodiment. Operation 390 is performed in the third processing chamber 1000', according to at least one embodiment.

According to some embodiments, the reflow includes annealing the doped copper seed layer 441 and the second copper layer 450 for about 30 seconds to about 60 seconds at a temperature of about 175° C. to about 350° C.

In other embodiments, operation 395 replaces operations 370, 380, 390. At operation 395, the second copper layer 450 is deposited while a substrate bias is applied. In one embodiment, the second copper layer 450 is deposited at a temperature from about 175° C. to about 350° C. while an RF bias with frequency of about 13.56 MHz is applied to the substrate 402. The applied RF bias increases the reflow of the second copper layer 450 and the doped copper seed layer 441. In these embodiments, the deposition of the second copper layer 450 occurs at the same time as the reflow of the second copper layer and the doped copper seed layer 441 is performed. In addition, operation 395 can be performed until the desired fill is achieved, and repetition of the operation 395 is not performed. Said in another way, operation 395 is a dynamic refill process this is performed until the desired fill is achieved. Operation 395 is performed in the third processing chamber 1000', according to at least one embodiment.

The dopant in the doped copper seed layer 441 improves flowability of the doped copper seed layer 441 and subsequent deposited copper layers, such as the second copper layer 450. Thus, the combined copper layer 460 has increased flowability, leading to a desired thickness profile. The combined copper layer 460 has reduced poor step coverage, overhang, and voids in the combined copper layer. The desired thickness profile increases reliability of the device structure 408, reducing device shorting and improving interconnection formation.

Figure 5:
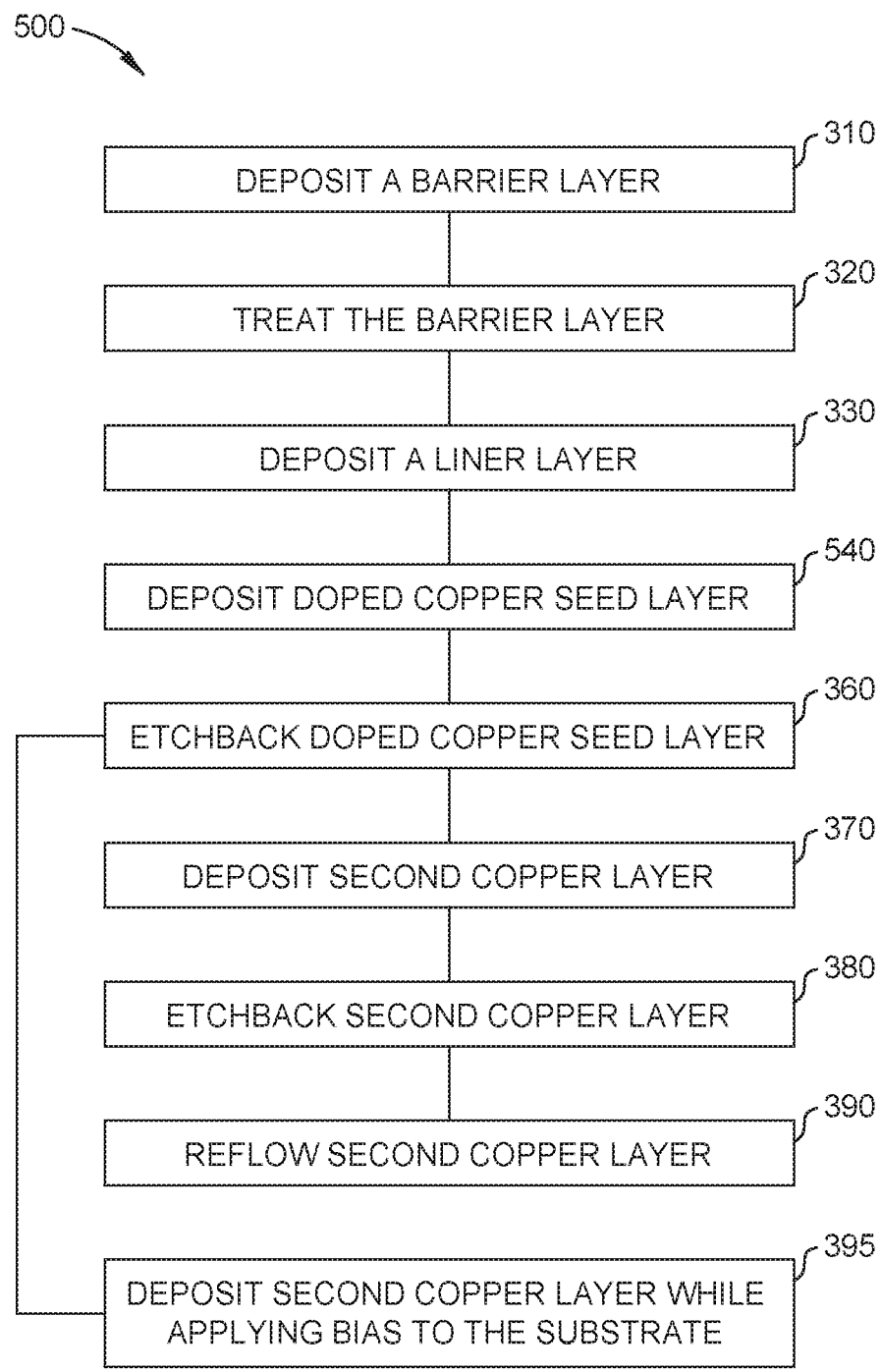
FIG. 5 is a flow diagram of method operations for depositing a plurality of layers, according to at least one embodiment.

FIG. 5 is a flow diagram of method 500 operations for depositing a plurality of layers in a device structure 408 (FIG. 6A), according to at least one embodiment. FIGS. 6A-6I illustrate a schematic side view of a device structure 408 during various operations of the method 500 of FIG. 5, according to at least one embodiment. The plurality of layers can includes any of the layers described in the method 500 below. Although the method 500 operations are described in conjunction with FIGS. 5 and 6A-6I, persons skilled in the art will understand that any system configured to perform the method operations, in any order, falls within the scope of the embodiments described herein. Any of the method 500 operations can be performed in any of the chambers of the multi-chamber processing system 200, such as processing chamber 150, processing chamber 1000, processing chamber 1000', or in any other suitable chamber. In addition, different operations of the method 500 can be performed in different chambers within the multi-chamber processing system 200, or in any other suitable chamber.

Figure 6A:
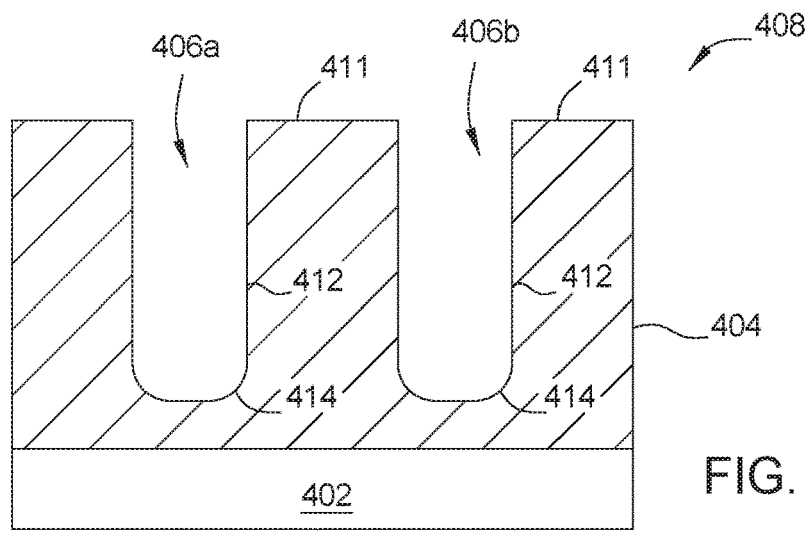
FIGS. 6A-6I illustrate a schematic side view of a device structure during various operations of the method of FIG. 5, according to at least one embodiment.

FIG. 6A illustrates a schematic side view of a device structure 408, according to at least one embodiment. The device structure 408 of FIG. 6A is similar to the device structure described in the discussion of FIG. 4A above.

Figure 6B:
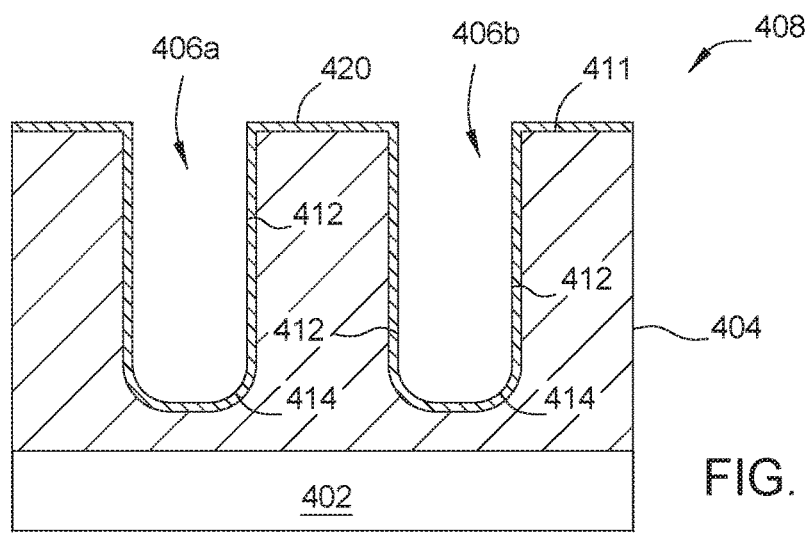

The method 500 begins at operation 310, where a barrier layer 420 is deposited on the device structure 408, such that the barrier layer substantially lines the side walls 412 and the bottom 414 of the feature definitions 406a, 406b. FIG. 6B illustrates the device structure 408 with the barrier layer 420, according to at least one embodiment.

Figure 6C:
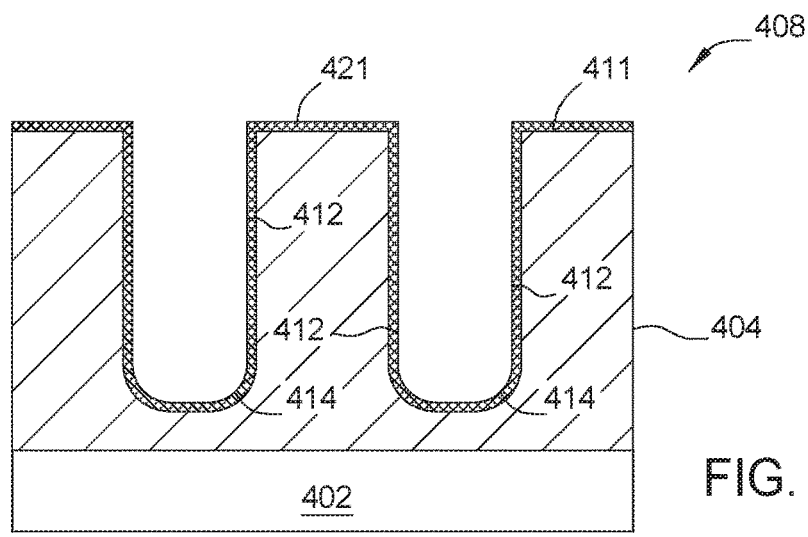

At operation 320, the barrier layer 420 is modified by a treatment process to become a treated barrier layer 421. FIG. 6C illustrates the device structure 408 with the treated barrier layer 421, according to at least one embodiment.

Figure 6D:
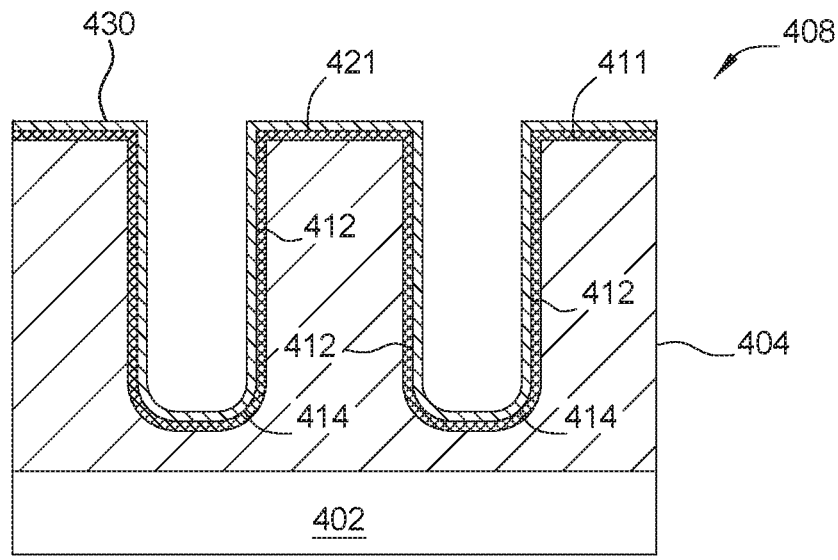

At operation 330, a liner layer 430 is deposited on the treated barrier layer 421. FIG. 6D illustrates the device structure 408 with the liner layer 430, according to at least one embodiment.

Figure 6E:
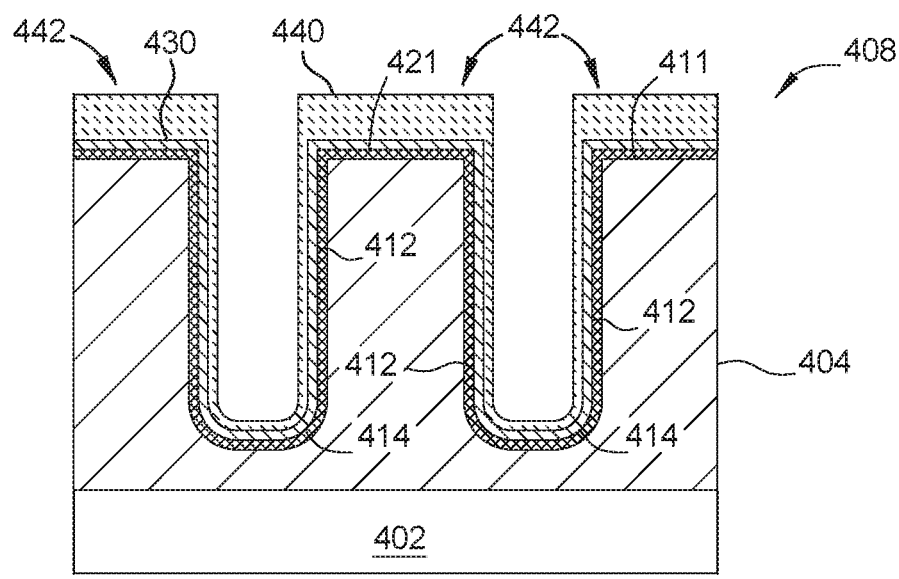

At operation 540, a doped copper seed layer 441 is deposited on the treated barrier layer 421. FIG. 6E illustrates the device structure 408 with the doped copper seed layer 441, according to at least one embodiment. The doped copper seed layer 441 can be deposited by any suitable method, such as, for example, PVD. The PVD is performed with a coil 1041 including Ta, V, and/or Nb, and thus the doped copper seed layer 441 includes Ta, V, and/or Nb as a dopant, according to at least one embodiment. The doped copper seed layer 441 is deposited using PVD using a target including Cu, such as target 1042. Operation 540 is performed in a second processing chamber 1000, according to at least one embodiment. Operation 540 is performed in a third processing chamber 1000', according to at least one embodiment.

According to some embodiments, the doped copper seed layer 441 has a thickness of about 60 Å, the doped copper seed layer is deposited using PVD using a Cu target and a Ta coil, and the deposition is performed for about 6 seconds to about 10 seconds at room temperature.

According to at least one embodiment, the doped copper seed layer 441 has a thickness of about 75 Å, the doped copper seed layer is deposited using PVD using a Cu target and a Ta coil, and the deposition is performed for about 7 seconds to about 13 seconds at room temperature.

Figure 6F:
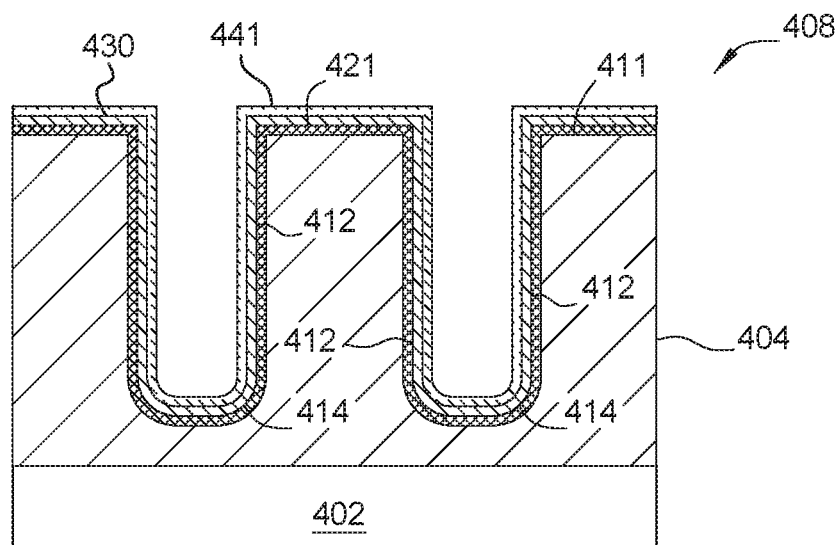

At operation 360, the doped copper seed layer 441 is etched back. FIG. 6F illustrates the device structure 408 with the doped copper seed layer 441 after the etchback is performed, according to at least one embodiment.

Figure 6G:
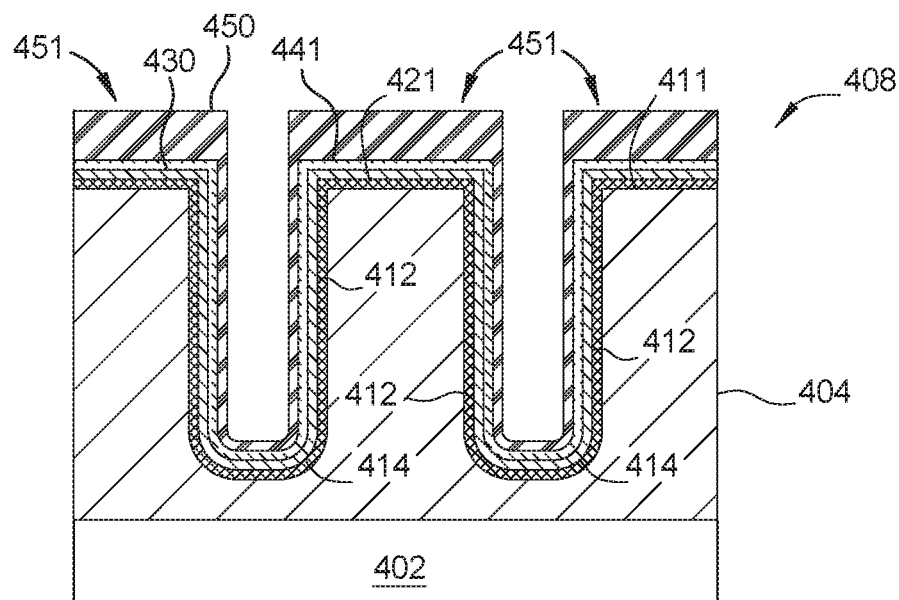

At operation 370, a second copper layer 450 is deposited on the doped copper seed layer 441. FIG. 6G illustrates the device structure 408 with the second copper layer 450, according to at least one embodiment.

Figure 6H:
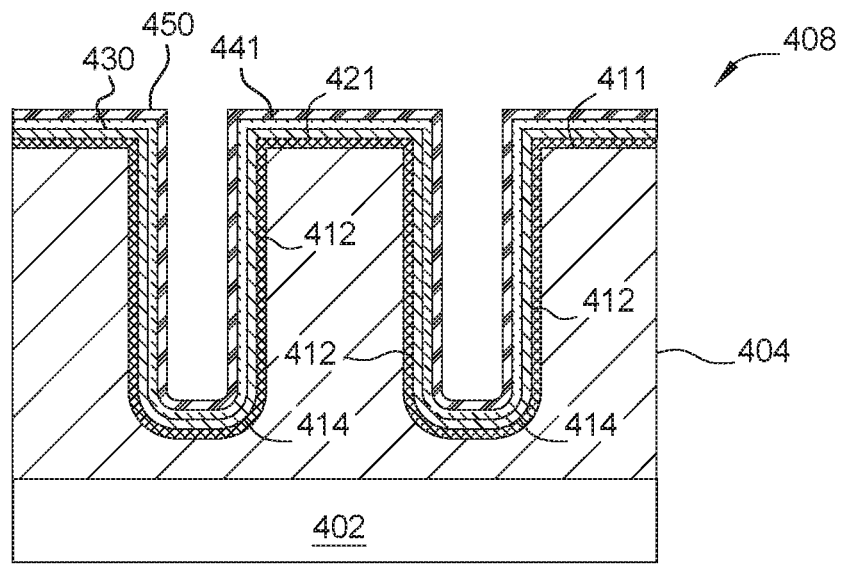

At operation 380, the second copper layer 450 is etched back. FIG. 6H illustrates the device structure 408 with the second copper layer 450 after the etchback is performed, according to at least one embodiment.

Figure 6I:
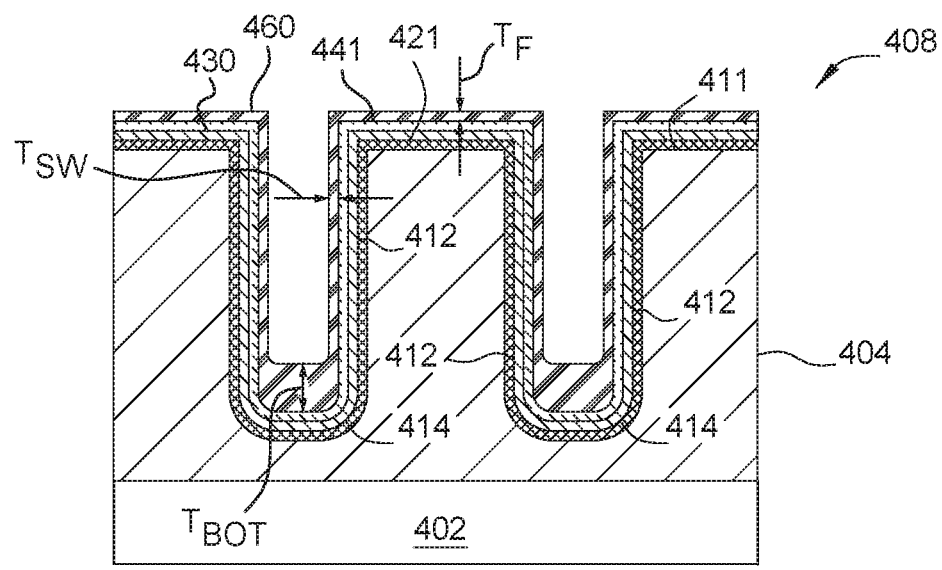

At operation 390, the doped copper seed layer 441 and the second copper layer 450 are reflowed to create a combined copper layer 460. FIG. 6I illustrates the device structure 408 with the combined copper layer 460, according to at least one embodiment.

In other embodiments, operation 395 replaces operations 370, 380, 390. At operation 395, the second copper layer 450 is deposited while a substrate bias is performed. In one embodiment, the second copper layer 450 is deposited at a temperature from about 175° C. to about 350° C. while an RF bias with frequency of about 13.56 MHz is applied to the substrate 402. The applied RF bias increases the reflow of the second copper layer 450 and the doped copper seed layer 441. In these embodiments, the deposition of the second copper layer 450 occurs at the same time as the reflow of the second copper layer and the doped copper seed layer 441 is performed. In addition, operation 395 can be performed until the desired fill is achieved, and repetition of the operation 395 is not performed. Said in another way, operation 395 is a dynamic refill process this is performed until the desired fill is achieved. Operation 395 is performed in the third processing chamber 1000', according to at least one embodiment.

Figure 7:
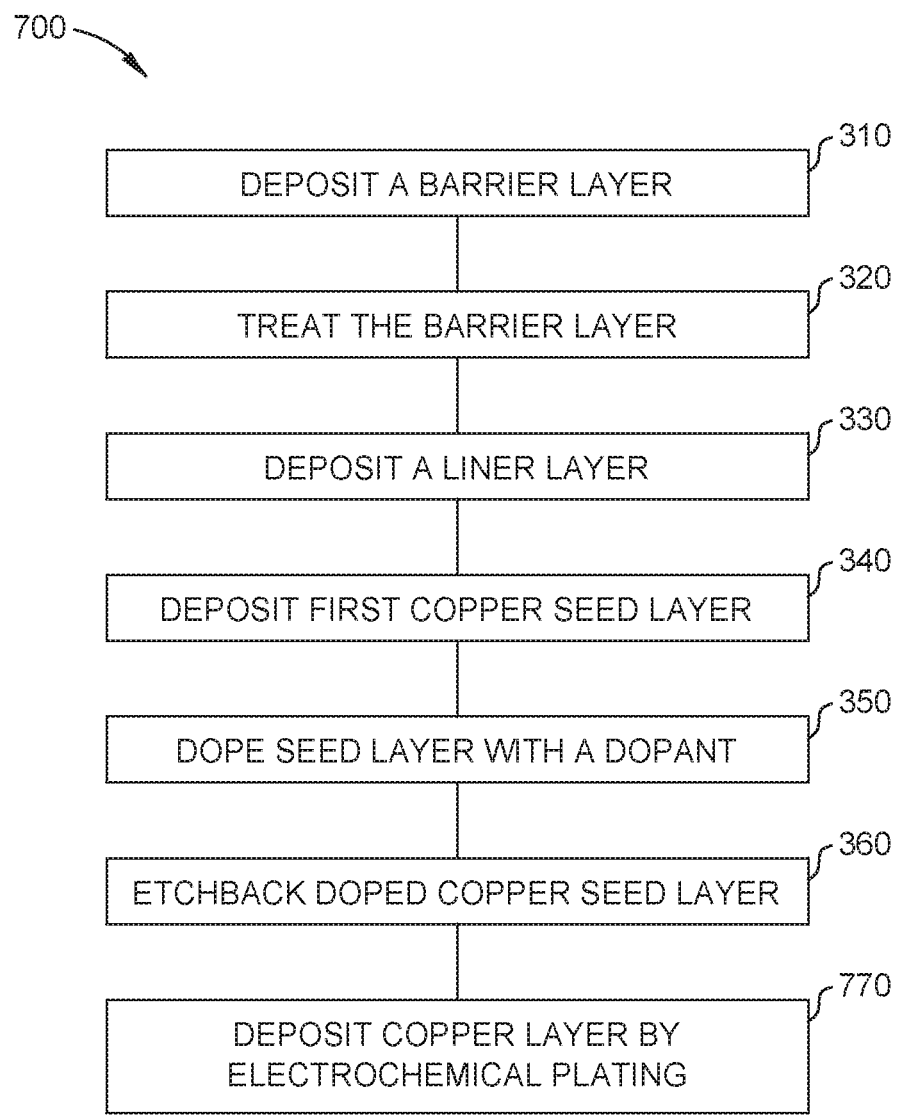
FIG. 7 is a flow diagram of method operations for depositing a plurality of layers, according to at least one embodiment.

FIG. 7 is a flow diagram of method 700 operations for depositing a plurality of layers in a device structure 408 (FIG. 8A), according to at least one embodiment. FIGS. 8A-8G illustrate a schematic side view of a device structure 408 during various operations of the method 700 of FIG. 7, according to at least one embodiment. The plurality of layers can includes any of the layers described in the method 700 below. Although the method 700 operations are described in conjunction with FIGS. 7 and 8A-8G, persons skilled in the art will understand that any system configured to perform the method operations, in any order, falls within the scope of the embodiments described herein. Any of the method 700 operations can be performed in any of the chambers of the multi-chamber processing system 200, such as processing chamber 150, processing chamber 1000, processing chamber 1000', or in any other suitable chamber. In addition, different operations of the method 700 can be performed in different chambers within the multi-chamber processing system 200, or in any other suitable chamber.

Figure 8A:
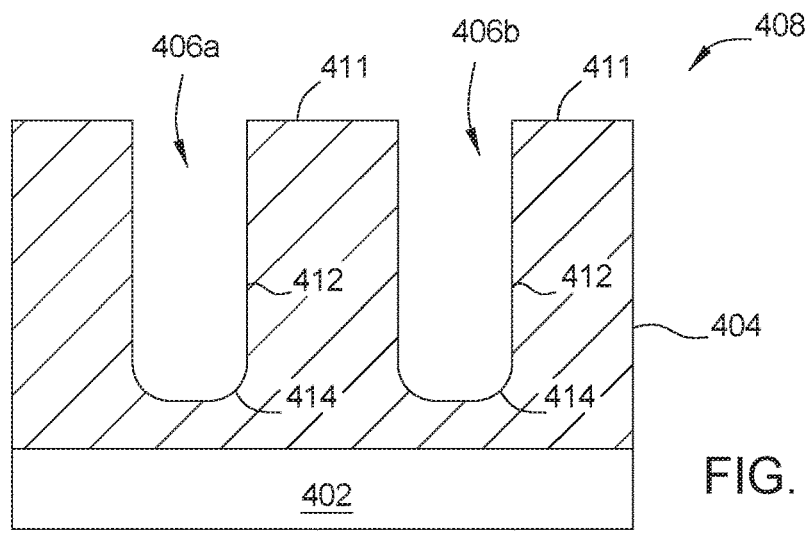
FIGS. 8A-8G illustrate a schematic side view of a device structure during various operations of the method of FIG. 7, according to at least one embodiment.

FIG. 8A illustrates a schematic side view of a device structure 408, according to at least one embodiment. The device structure 408 of FIG. 8A is similar to the device structure described in the discussion of FIG. 4A above.

Figure 8B:
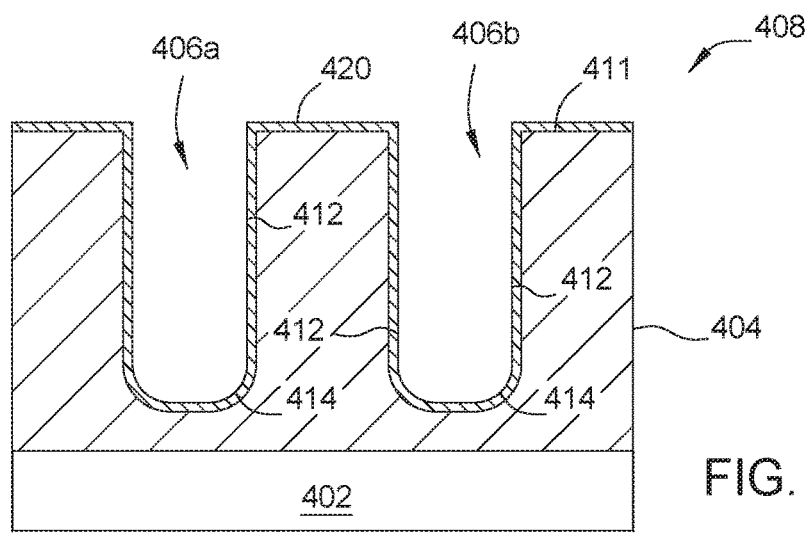

The method 700 begins at operation 310, where a barrier layer 420 is deposited on the device structure 408, such that the barrier layer substantially lines the side walls 412 and the bottom 414 of the feature definitions 406a, 406b. FIG. 8B illustrates the device structure 408 with the barrier layer 420, according to at least one embodiment.

Figure 8C:
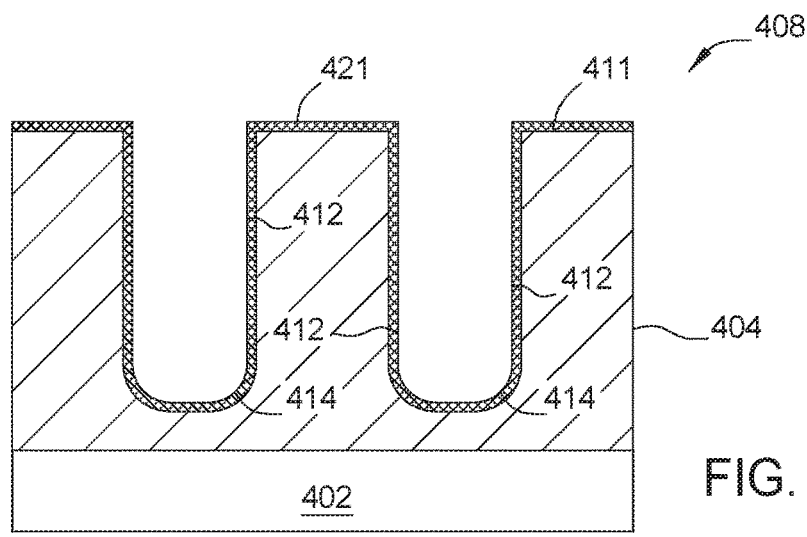

At operation 320, the barrier layer 420 is modified by a treatment process to become a treated barrier layer 421. FIG. 8C illustrates the device structure 408 with the treated barrier layer 421, according to at least one embodiment.

Figure 8D:
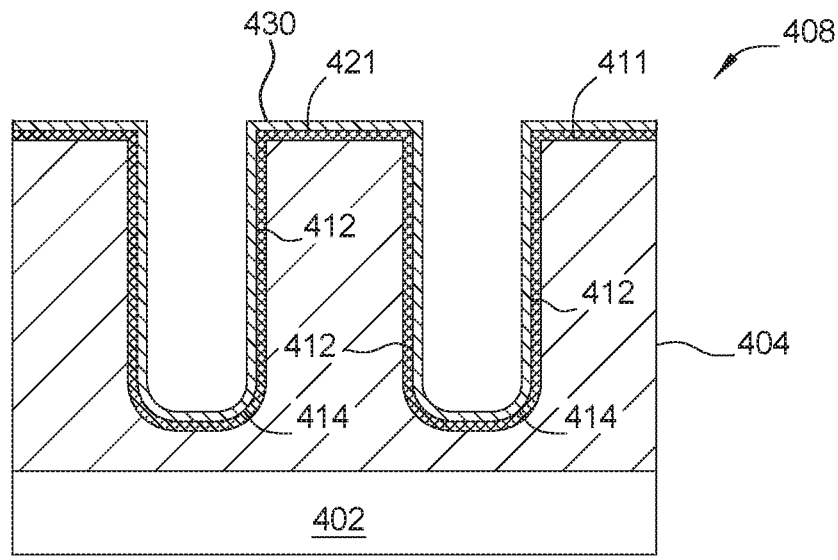

At operation 330, a liner layer 430 is deposited on the treated barrier layer 421. FIG. 8D illustrates the device structure 408 with the liner layer 430, according to at least one embodiment.

Figure 8E:
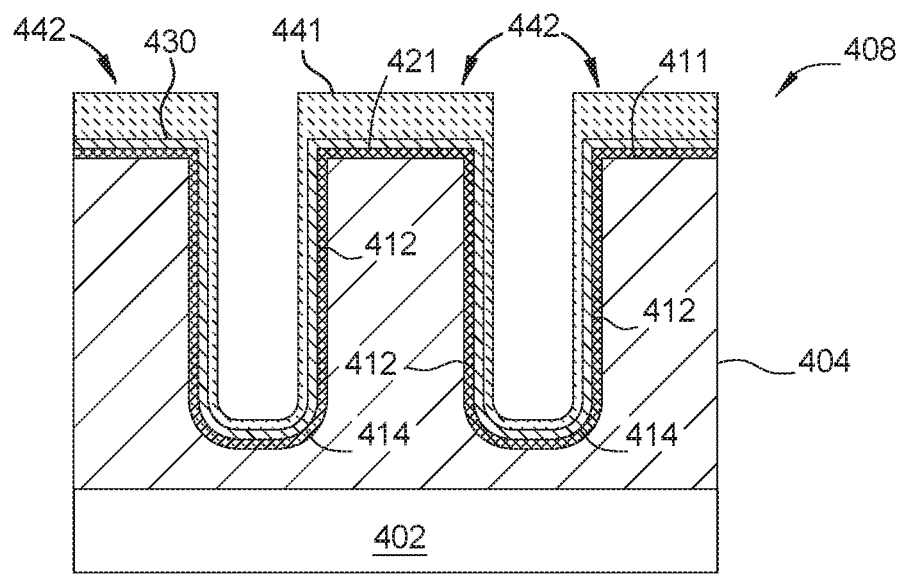

At operation 540, a doped copper seed layer 441 is deposited on the treated barrier layer 421. FIG. 8E illustrates the device structure 408 with the doped copper seed layer 441, according to at least one embodiment.

Figure 8F:
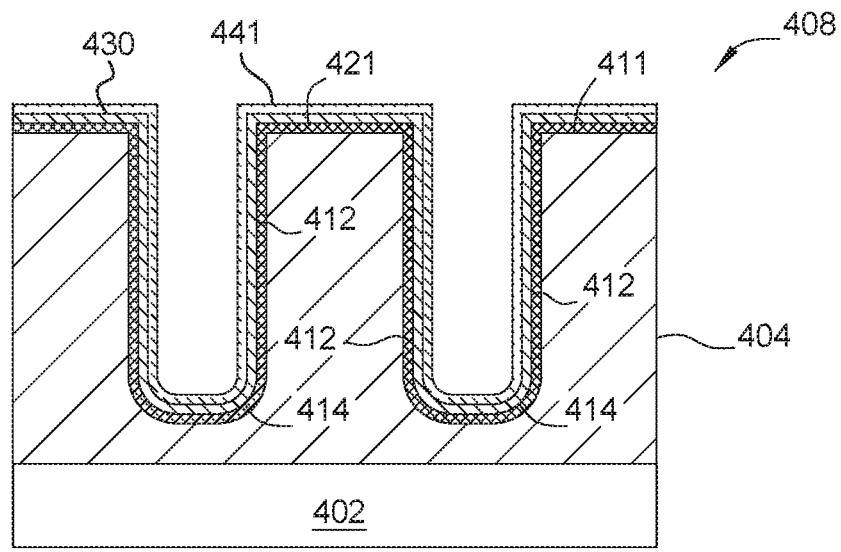

At operation 360, the doped copper seed layer 441 is etched back. FIG. 8F illustrates the device structure 408 with the doped copper seed layer 441 after the etchback is performed, according to at least one embodiment.

Figure 8G:
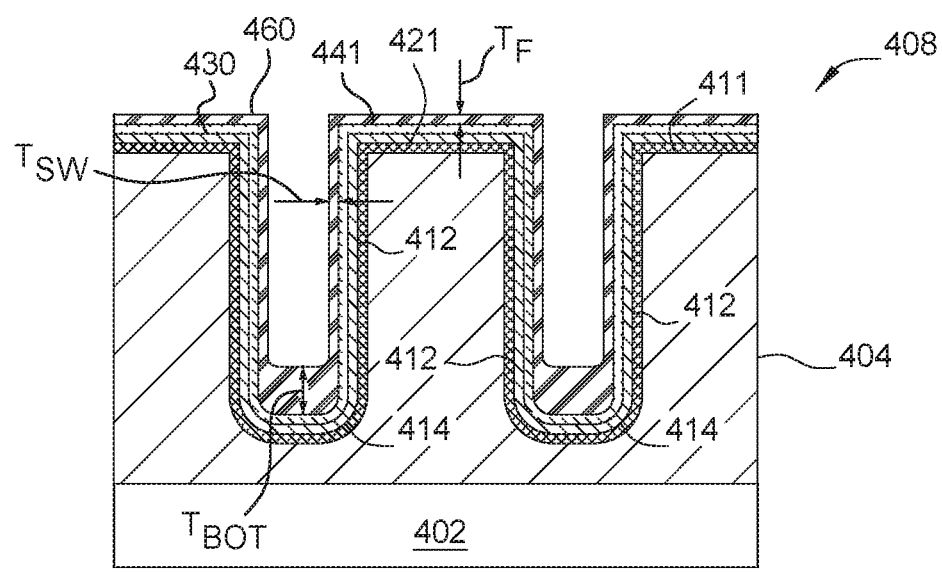

At operation 770, a second copper layer 450 is deposited on the doped copper seed layer 441 using an ECP process. FIG. 8G illustrates the device structure 408 with the second copper layer 450, according to at least one embodiment. Operation 770 can be performed until the desired fill is achieved, and repetition of the operation 770 is not performed.

According to at least some embodiments, the second copper layer 450 has a thickness of about 300 Å, the second copper seed layer is deposited using ECP, and the deposition is performed for about 3 seconds to about 5 seconds at room temperature.

As described above, a doped copper seed layer is deposited in a plurality of feature definitions in a device structure. A first copper seed layer is deposited and then the first copper seed layer is doped to form a doped copper seed layer, or a doped copper seed layer is deposited directly. At least one more copper layer is deposited, and the copper layers are reflowed to create a combined copper layer.

The combined copper layer has a desired thickness profile. The doped copper seed layer leads to increased flowability, reducing poor step coverage, overhang, and voids in the combined copper layer. The desired thickness profile increases reliability of the device structure, reducing device shorting and improving interconnection formation. In addition, the combined copper layer is thinner than previously used in the art, allowing for coating of features for the N3 node.

While the foregoing is directed to implementations of the present disclosure, other and further implementations of the disclosure may be devised without departing from the basic scope thereof, and the scope thereof is determined by the claims that follow.

The invention claimed is:

1. A method for depositing a plurality of layers, comprising:
   depositing a barrier layer over a device structure, the device structure comprising a layer disposed over a substrate, the layer having a surface and a plurality of feature definitions, each of the feature definitions having a plurality of side walls and a bottom, wherein the barrier layer is disposed over the surface, the plurality of side walls and the bottom;
   treating the barrier layer to create a treated barrier layer;
   depositing a liner layer on the treated barrier layer;
   depositing a first copper seed layer on the liner layer;
   doping the first copper seed layer with a dopant to create a doped copper seed layer having one or more seed layer portions; and
   etching back the doped copper seed layer such that at least one of the one or more seed layer portions is removed;
   depositing a second copper layer having one or more copper layer portions over the doped copper seed layer;
   etching back the second copper layer such that at least one of the one or more copper layer portions is removed; and
   reflowing the doped copper seed layer and the second copper layer to create a combined copper layer,
   wherein
      the treating the barrier layer, the doping the first copper seed layer, and the etching back the doped copper seed layer are performed in a first processing chamber, and
      the depositing a first copper seed layer, the depositing a second copper layer, the etching back the second copper layer and the reflowing the doped copper seed layer and the second copper layer are performed in a second processing chamber.

2. The method of claim 1, wherein the dopant comprises tantalum (Ta), vanadium (V), niobium (Nb), or combinations thereof.

3. The method of claim 2, wherein the doping the first copper seed layer is performed using physical vapor deposition of a target comprising Ta, V, Nb, or combinations thereof.

4. The method of claim 1,
   wherein the barrier layer comprises a metal; and
   the liner layer comprises a metal.

5. The method of claim 1, wherein the second copper layer has a thickness profile comprising:
   a side wall thickness disposed adjacent to one of the plurality of side walls;
   a field thickness disposed over the surface; and
   a bottom thickness disposed at the bottom of one of the plurality of feature definitions, wherein the side wall thickness is approximately equal to the field thickness, and the bottom thickness is greater than the side wall thickness.

6. A method for depositing a plurality of layers, comprising:
   depositing a barrier layer over a surface of a plurality of features of a device structure;
   depositing a liner layer on the barrier layer;
   depositing a first copper seed layer on the liner layer;
   doping the first copper seed layer with a dopant to create a doped copper seed layer having one or more seed layer portions;
   etching back the doped copper seed layer such that at least one of the one or more seed layer portions is removed;

depositing a second copper layer having one or more copper layer portions over the doped copper seed layer;

etching back the second copper layer such that at least one of the one or more copper layer portions is removed; and reflowing the doped copper seed layer and the second copper layer to create a combined copper layer, wherein the doping the first copper seed layer, and the etching back the doped copper seed layer are performed in a first processing chamber, and the depositing a first copper seed layer, the depositing a second copper layer, the etching back the second copper layer and the reflowing the doped copper seed layer and the second copper layer are performed in a second processing chamber.

7. The method of claim 6, further comprising treating the barrier layer to create a treated barrier layer.

8. The method of claim 7, wherein treating the barrier layer is performed in the first processing chamber.

9. The method of claim 6, wherein the barrier layer and the liner layer both comprise a metal.

10. The method of claim 6, wherein the dopant comprises tantalum (Ta), vanadium (V), niobium (Nb), or combinations thereof.

11. The method of claim 10, wherein the doping the first copper seed layer is performed using physical vapor deposition of a target comprising Ta, V, Nb, or combinations thereof.

12. The method of claim 6, wherein the device structure comprises a layer disposed over a substrate, wherein the surface of the plurality of the features of the device structure includes an uppermost surface of the layer and a plurality of feature definitions in the layer, each of the feature definitions having a plurality of side walls and a bottom, and wherein the second copper layer has a thickness profile comprising:

a side wall thickness disposed adjacent to one of the plurality of side walls;

a field thickness disposed over the uppermost surface of the layer; and a bottom thickness disposed at the bottom of one of the plurality of feature definitions, wherein the side wall thickness is approximately equal to the field thickness, and the bottom thickness is greater than the side wall thickness.

* * * * *